(12) United States Patent
Takimoto

(10) Patent No.: US 9,490,441 B2
(45) Date of Patent: Nov. 8, 2016

(54) SEMICONDUCTOR DEVICE, METHOD OF MANUFACTURING SEMICONDUCTOR DEVICE, SOLID-STATE IMAGE PICKUP UNIT, AND ELECTRONIC APPARATUS

(71) Applicant: SONY CORPORATION, Tokyo (JP)

(72) Inventor: Kaori Takimoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 86 days.

(21) Appl. No.: 14/417,392

(22) PCT Filed: Jul. 25, 2013

(86) PCT No.: PCT/JP2013/070131
§ 371 (c)(1),
(2) Date: Jan. 26, 2015

(87) PCT Pub. No.: WO2014/021177
PCT Pub. Date: Feb. 6, 2014

(65) Prior Publication Data
US 2015/0188065 A1    Jul. 2, 2015

(30) Foreign Application Priority Data
Aug. 2, 2012   (JP) ................................. 2012-171885

(51) Int. Cl.
| | |
|---|---|
| *H01L 51/40* | (2006.01) |
| *H01L 51/44* | (2006.01) |
| *H01L 27/146* | (2006.01) |
| *H01L 51/00* | (2006.01) |
| *H01L 27/30* | (2006.01) |

(52) U.S. Cl.
CPC ......... *H01L 51/445* (2013.01); *H01L 27/1462* (2013.01); *H01L 27/1464* (2013.01); *H01L 27/14647* (2013.01); *H01L 27/14685* (2013.01); *H01L 51/0021* (2013.01); *H01L 51/442* (2013.01); *H01L 27/307* (2013.01); *H01L 2251/306* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | | |
|---|---|---|---|---|
| 2005/0040759 A1* | 2/2005 | Kobayashi | .......... | H01L 51/5234 313/506 |
| 2015/0188065 A1* | 7/2015 | Takimoto | ............ | H01L 27/1462 257/40 |

OTHER PUBLICATIONS

International Search Report prepared by the Japanese Patent Office on Sep. 3, 2013, for International Application No. PCT/JP2013/070131.

* cited by examiner

*Primary Examiner* — Jack Chen
(74) *Attorney, Agent, or Firm* — Chip Law Group

(57) ABSTRACT

There are provided a semiconductor device capable of adjusting a work function without reducing light transmittance of an electrode, a method of manufacturing this semiconductor device, a solid-state image pickup unit including this semiconductor device, and an electronic apparatus including this solid-state image pickup action. The semiconductor device includes a functional layer between a first electrode and a second electrode, the functional layer including an organic film, in which the first electrode and the second electrode are made of a same transparent conductive material, and an oxygen amount at an interface on the functional layer side of the first electrode is smaller than an oxygen amount at an interface on the functional layer side of the second electrode.

20 Claims, 44 Drawing Sheets

LOWER-SIDE DRAWING (HOLES)

LOWER-SIDE DRAWING (HOLES)

UPPER-SIDE DRAWING (ELECTRONS AND HOLES)

SEMICONDUCTOR DEVICE, METHOD OF MANUFACTURING SEMICONDUCTOR DEVICE, SOLID-STATE IMAGE PICKUP UNIT, AND ELECTRONIC APPARATUS

CROSS REFERENCE TO RELATED APPLICATIONS

This application is a national stage application under 35 U.S.C. 371 and claims the benefit of PCT Application No. PCT/JP2013/070131 having an international filing date of Jul. 25, 2013, which designated the United States, which PCT application claimed the benefit of Japanese Patent Application No. 2012-171885 filed Aug. 2, 2012, the disclosures of both the above-identified applications are incorporated herein by reference.

TECHNICAL FIELD

The present disclosure relates to a semiconductor device including an organic film, a method of manufacturing the semiconductor device, a solid-state image pickup unit including the semiconductor device, and an electronic apparatus including the solid-state image pickup unit.

BACKGROUND ART

Semiconductor devices such as organic photoelectric conversion devices, organic EL (Electroluminescence) devices, and organic solar cell devices may have, for example, a configuration in which an organic film is sandwiched between a lower electrode (a first electrode) and an upper electrode (a second electrode). Such semiconductor devices may need light transmittance depending on the purpose of use, and for such a purpose, a transparent conductive film, for example, ITO (Indium Tin Oxide) is used as the upper electrode and the lower electrode.

Since transparent conductive materials typified by ITO have a large work function as described in, for example, PTL 1, hole injection into an organic film is likely to occur, thereby causing an increase in a dark current. Therefore, in PTL 1, the work function of the lower electrode is reduced by configuring, as the lower electrode, a laminate configuration of a transparent ITO electrode and a metal thin film to reduce the dark current.

CITATION LIST

Patent Literature

PTL 1: Japanese Unexamined Patent Application Publication No. 2007-67194

SUMMARY OF INVENTION

However, transmittance of the metal film is extremely low; therefore, even if the metal film is extremely thin, light transmittance of the electrode may be reduced by inserting the metal film.

Therefore, it is desirable to provide a semiconductor device capable of adjusting a work function without reducing light transmittance of an electrode, a method of manufacturing the semiconductor device, a solid-state image pickup unit including the semiconductor device, and an electronic apparatus including the solid-state image pickup action.

A semiconductor device according to an embodiment of the present disclosure includes: a functional layer between a first electrode and a second electrode, the functional layer including an organic film, in which the first electrode and the second electrode are made of a same transparent conductive material, and an oxygen amount at an interface on the functional layer side of the first electrode is smaller than an oxygen amount at an interface on the functional layer side of the second electrode.

In the semiconductor device of the embodiment of the present disclosure, the first electrode and the second electrode are configured of the same transparent conductive material, and the oxygen amount at the interface on the functional layer side of the first electrode is smaller than the oxygen amount at the interface on the functional layer side of the second electrode; therefore, a work function at the interface on the functional layer side of the first electrode is reduced.

A first method of manufacturing a semiconductor device according to an embodiment of the present disclosure includes the following (A) to (E):

(A) forming a first electrode made of a transparent conductive material;

(B) forming an inorganic oxide layer with a higher metal content ratio than that in an ideal composition on the first electrode;

(C) forming a reduced layer in a part or a whole in a thickness direction from an interface on the functional layer side of the first electrode by annealing treatment and allowing an oxygen amount of the reduced layer to be smaller than an oxygen amount of the transparent conductive material;

(D) forming a functional layer including an organic film on the inorganic oxide layer; and (E) forming a second electrode made of the same transparent conductive material as that of the first electrode on the functional layer.

A second method of manufacturing a semiconductor device according to an embodiment of the present disclosure includes the following (A) to (E):

(A) forming a first electrode made of a transparent conductive material;

(B) forming a first layer and a second layer on the first electrode in this order from the first electrode side, the first layer made of an inorganic oxide with a higher metal content ratio than that in an ideal composition or a metal, and the second layer made of an inorganic oxide with a larger oxygen amount than that of the first layer;

(C) forming a reduced layer in a part or a whole in a thickness direction from an interface on the functional layer side of the first electrode by annealing treatment, and allowing an oxygen amount of the reduced layer to be smaller than an oxygen amount of the transparent conductive material;

(D) forming a functional layer including an organic film on the second layer; and (E) forming a second electrode made of the same transparent conductive material as that of the first electrode on the functional layer.

A third method of manufacturing a semiconductor device according to an embodiment of the present disclosure includes the following (A) to (D):

(A) forming a first electrode made of a transparent conductive material;

(B) forming a functional layer including an organic film on the first electrode;

(C) forming a second electrode made of the same transparent conductive material as that of the first electrode on the functional layer; and (D) allowing, by annealing treatment, an oxygen amount at an interface on the functional layer side of the second electrode to be larger than an oxygen amount at an interface on the functional layer side of the first electrode.

A solid-state image pickup unit according to an embodiment of the present disclosure provided with pixels each of which includes one or a plurality of organic photoelectric conversion sections, the organic photoelectric conversion sections each including: a functional layer between a first electrode and a second electrode, the functional layer including an organic film, in which the first electrode and the second electrode are made of a same transparent conductive material, and an oxygen amount at an interface on the functional layer side of the first electrode is smaller than an oxygen amount at an interface on the functional layer side of the second electrode.

In the solid-state image pickup unit of the embodiment of the present disclosure, functions such as photoelectric conversion are carried out by the organic photoelectric conversion section.

An electronic apparatus according to an embodiment of the present disclosure provided with a solid-state image pickup unit, the solid-state image pickup unit including pixels each of which includes one or a plurality of organic photoelectric conversion sections, the organic photoelectric conversion sections each including: a functional layer between a first electrode and a second electrode, the functional layer including an organic film, in which the first electrode and the second electrode are made of a same transparent conductive material, and an oxygen amount at an interface on the functional layer side of the first electrode is smaller than an oxygen amount at an interface on the functional layer side of the second electrode.

In the electronic apparatus of the embodiment of the present disclosure, image pickup is performed by the solid-state image pickup unit.

According to the semiconductor device of the embodiment of the present disclosure, the first electrode and the second electrode are made of the same transparent conductive material, and the oxygen amount at the interface on the functional layer side of the first electrode is smaller than the oxygen amount at the interface on the functional layer side of the second electrode. Therefore, the work function is allowed to be adjusted without reducing light transmittance of electrodes. According to the solid-state image pickup unit of the embodiment of the present disclosure, the organic photoelectric conversion section is configured of the above-described semiconductor device of the embodiment of the present disclosure; therefore, a current is easily drawn, and sensitivity is improved. Moreover, according to the electronic apparatus of the embodiment of the present disclosure, the above-described solid-state image pickup unit of the embodiment of the present disclosure is included; therefore, image pickup with high image quality is allowed to be performed.

According to the first method of manufacturing the semiconductor device of the embodiment of the present disclosure, the inorganic oxide layer with a higher metal content ratio than that in the ideal composition is formed, and while the reduced layer is formed in a part or a whole in the thickness direction from the interface on the functional layer side of the first electrode by annealing treatment, the oxygen amount of the reduced layer is allowed to be smaller than the oxygen amount of the transparent conductive material.

According to the second method of manufacturing the semiconductor device of the embodiment of the present disclosure, the first layer made of the inorganic oxide with a higher metal content ratio than that in the ideal composition or the metal and the second layer made of the inorganic oxide with a larger oxygen amount than the first layer are formed in this order on the first electrode, and while the reduced layer is formed in a part or a whole in the thickness direction from the interface on the functional layer side of the first electrode by annealing treatment, the oxygen amount of the reduced layer is allowed to be smaller than the oxygen amount of the transparent conductive material. According to the third method of manufacturing the semiconductor device of the embodiment of the present disclosure, the oxygen amount at the interface on the functional layer side of the second electrode is allowed to be larger than the oxygen amount at the interface on the functional layer side of the first electrode by annealing treatment. Therefore, the above-described semiconductor device of the embodiment of the present disclosure is allowed to be manufactured easily.

DESCRIPTION OF EMBODIMENTS

Some embodiments of the present disclosure will be described in detail below referring to the accompanying drawings. It is to be noted that description will be given in the following order.

1. First Embodiment (Example in which an inorganic oxide layer is provided on a lower electrode and a reduced layer is formed by annealing treatment)
2. Modification Example 1 (Another example of a method of forming an insulating film)
3. Second Embodiment (Example in which two inorganic oxide layers are provided)
4. Modification Example 2 (Example in which a lower electrode and an inorganic insulating layer are processed after forming a reduced layer)
5. Third Embodiment (Example in which annealing treatment of an upper electrode is performed)
6. Modification Example 3 (Example in a case where holes are drawn as signal charges from a lower electrode side)
7. Modification Example 4 (Example in a case where electrons/holes are drawn as signal charges from an upper electrode side)
8. Application Example 1 (Example of solid-state image pickup unit)
9. Application Example 2 (Example of electronic apparatus (camera))

First Embodiment

Figure 1:
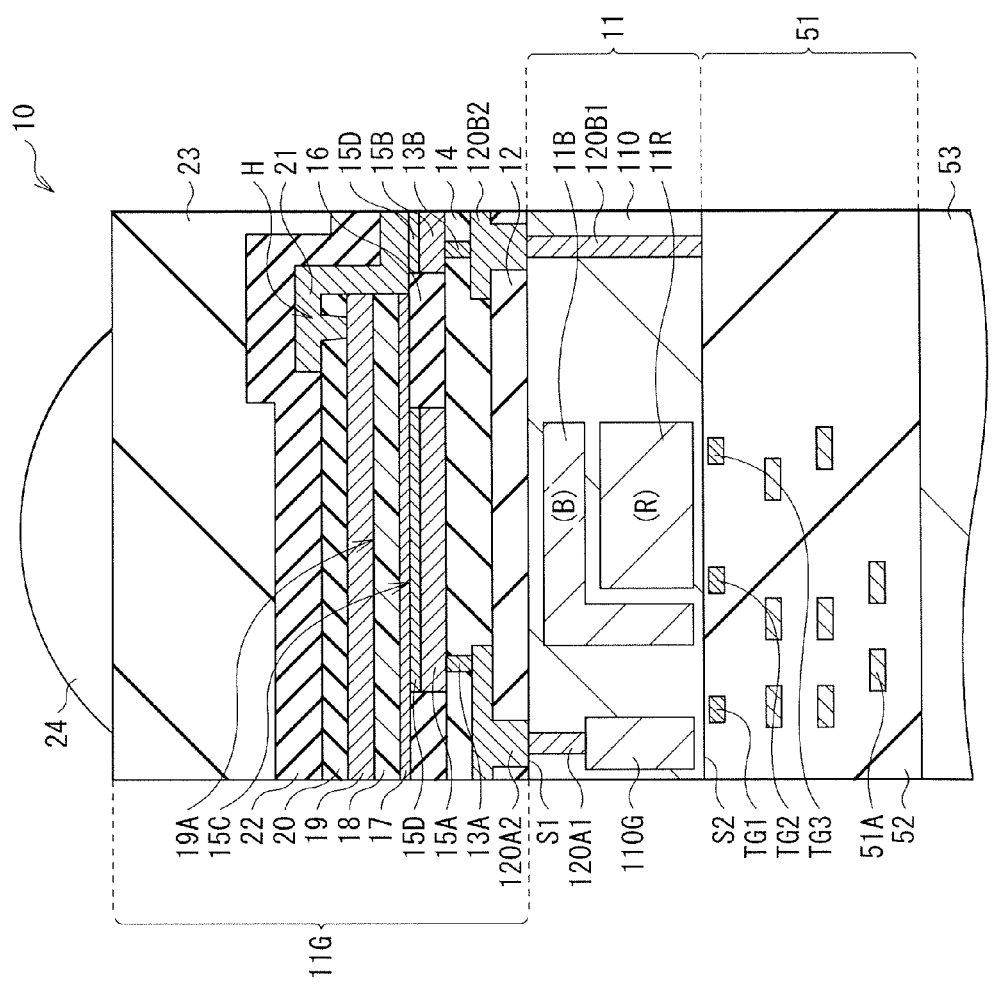
FIG. 1 is a sectional view illustrating a schematic configuration of a semiconductor device (a photoelectric conversion device) according to a first embodiment of the present disclosure.

FIG. 1 illustrates a sectional configuration of a semiconductor device (a photoelectric conversion device) according to a first embodiment of the present disclosure. The photoelectric conversion device 10 may configure, for example, one pixel in a solid-state image pickup unit (that will be described later) such as a CCD (Charge Coupled Device) image sensor or a CMOS (Complementary Metal Oxide Semiconductor) image sensor.

The photoelectric conversion device 10 may have, for example, a configuration in which an organic photoelectric conversion section and an inorganic photoelectric conversion section that are configured to selectively detect light in wavelength ranges different from each other to perform photoelectric conversion are laminated in a vertical direction. Therefore, in the solid-state image pickup unit that will be described later, one pixel is capable of obtaining a plurality of kinds of color signals without using a color filter. More specifically, the photoelectric conversion device 10 has a laminate configuration of one organic photoelectric conversion section 11G and two inorganic photoelectric conversion sections 11B and 11R, thereby obtaining respective color signals of red (R), green (G), and blue (B). The organic photoelectric conversion section 11G is provided on a back surface (a surface S1) of a semiconductor substrate 11, and the back surface (the surface S1) serves as a light reception surface. The inorganic photoelectric conversion sections 11B and 11R are embedded in the semiconductor substrate 11.

The photoelectric conversion device 10 includes pixel transistors (including transfer transistors Tr1 to Tr3 that will be described later) on a front surface (a surface S2 opposite to the light reception surface) side of the semiconductor substrate 11, and includes a multilayer wiring layer (a multilayer wiring layer 51). Configurations of respective components will be described below.

(Semiconductor Substrate 11)

The semiconductor substrate 11 may be configured by embedding the inorganic photoelectric conversion sections 11B and 11R and a green storage layer 110G in a predetermined region of, for example, an n-type silicon (Si) layer 110. Conductive plugs 120A1 and 120B1 serving as transmission paths for charges (electrons or holes) from the organic photoelectric conversion section 11G are further embedded in the semiconductor substrate 11. A plurality of pixel transistors (including the transfer transistors Tr1 to Tr3) corresponding to the organic photoelectric conversion section 11G, and the inorganic photoelectric conversion sections 11B and 11R, respectively, and a peripheral circuit section configured of a logic circuit and the like are provided on the front surface (the surface S2) side of the semiconductor substrate 11.

Examples of the pixel transistors include a transfer transistor, a reset transistor, an amplification transistor, and a selection transistor. Each of these pixel transistors may be configured of, for example, a MOS transistor, and is formed in a p-type semiconductor well region on the surface S2 side. A circuit including such pixel transistors is formed in each of red, green, and blue photoelectric conversion sections. Each circuit may have, for example, a three-transistor configuration including three transistors in total, i.e., a transfer transistor, a reset transistor, and an amplification transistor, or a four-transistor configuration including a selection transistor in addition to these transistors. Only the transfer transistors Tr1 to Tr3 of these pixel transistors will be illustrated and described here. Moreover, the pixel transistors other than the transfer transistor may be shared among the photoelectric conversion sections or among pixels. Moreover, a so-called pixel sharing configuration in which a floating diffusion is shared may be applicable.

The transfer transistors Tr1 to Tr3 are configured by including gate electrodes (gate electrodes TG1 to TG3) and floating diffusions (FDs 113, 114, and 116). The transfer transistor Tr1 is configured to transfer, to a vertical signal line Lsig that will be described later, signal charges (electrons in this embodiment) corresponding to green generated in the organic photoelectric conversion section 11G and stored in the green storage layer 110G. The transfer transistor Tr2 is configured to transfer, to the vertical signal line Lsig that will be described later, signal charges (electrons in this embodiment) corresponding to blue generated and stored in the inorganic photoelectric conversion section 11B. Likewise, the transfer transistor Tr3 is configured to transfer, to the vertical signal line Lsig that will be described later, signal charges (electrons in this embodiment) corresponding to red generated and stored in the inorganic photoelectric conversion section 11R.

The inorganic photoelectric conversion sections 11B and 11R are photodiodes having a pn junction, and are formed on an optical path in the semiconductor substrate 11 in order of the inorganic photoelectric conversion sections 11B and 11R from the surface S1 side. The inorganic photoelectric conversion section 11B of them is configured to selectively detect blue light and accumulate the signal charges corresponding to blue, and extends, for example, from a selective region along the surface S1 of the semiconductor substrate 11 to a region in proximity to an interface with the multilayer wiring layer 51. The inorganic photoelectric conversion section 11R is configured to selectively detect red light and accumulate the signal charges corresponding to red, and may be provided throughout, for example, a region below the inorganic photoelectric conversion section 11B (on the surface S2 side). It is to be noted that blue (B) may be, for example, a color corresponding to a wavelength range of 450 nm to 495 nm, red (R) may be, for example, a color corresponding to a wavelength range of 620 nm to 750 nm, and each of the inorganic photoelectric conversion sections 11B and 11R may detect light in a part or a whole of each of the wavelength ranges.

Figure 2:
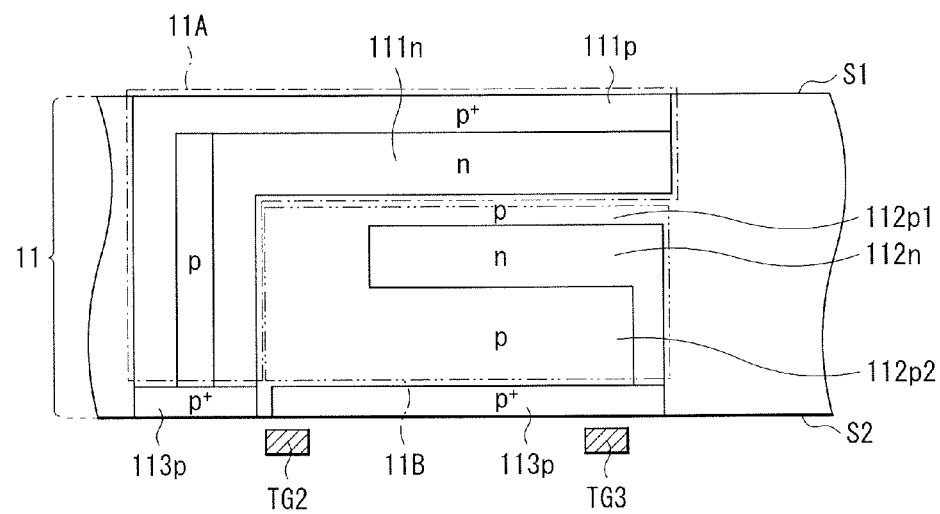
FIG. 2 is a sectional view illustrating an example of a configuration of an inorganic photoelectric conversion section illustrated in FIG. 1.
Figure 3:
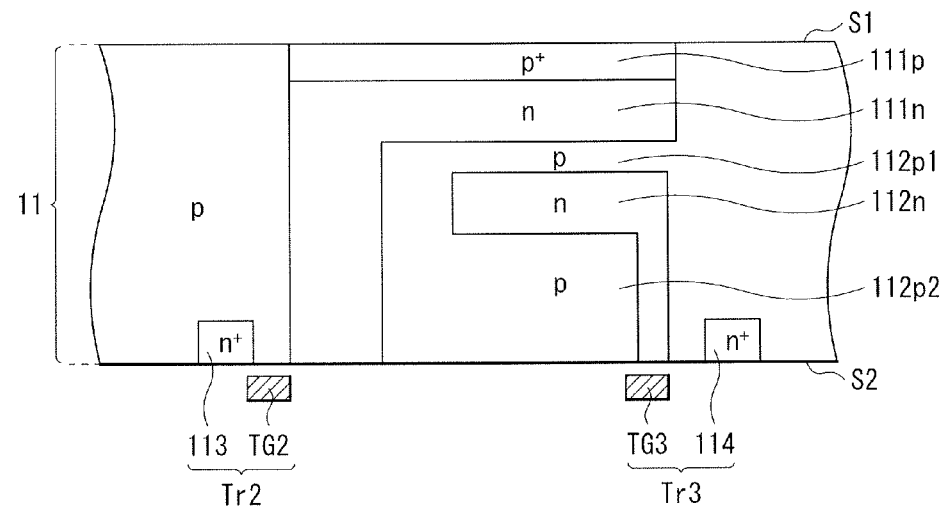
FIG. 3 is a sectional view illustrating an example of another sectional configuration of the inorganic photoelectric conversion section illustrated in FIG. 2.

FIG. 2 illustrates a specific configuration example of the inorganic photoelectric conversion sections 11B and 11R. FIG. 3 corresponds to a configuration of another section in FIG. 2. It is to be noted that a case where electrons of pairs of electrons and holes generated by photoelectric conversion are read as signal charges (a case where an n-type semiconductor region serves as a photoelectric conversion layer) will be described in this embodiment. Moreover, in the diagrams, a superscript "+ (plus)" placed at "p" or "n" indicates that p-type or n-type impurity concentration is high. Further, gate electrodes TG2 and TG3 of the transfer transistors Tr2 and Tr3 of the pixel transistors are also illustrated.

The inorganic photoelectric conversion section 11B may be configured by including, for example, a p-type semiconductor region (hereinafter simply referred to as "p-type region", an n-type semiconductor region is referred in a similar manner) 111*p* serving as a hole storage layer and an n-type photoelectric conversion layer (an n-type region) 111*n* serving as an electron storage layer. The p-type region 111*p* and the n-type photoelectric conversion layer 111*n* are provided to respective selective regions in proximity to the surface S1, and each of them is bent and extends to allow a part thereof to reach an interface with the surface S2. The p-type region 111*p* is connected to a p-type semiconductor well region that is not illustrated on the surface S1 side. The n-type photoelectric conversion layer 111*n* is connected to the FD 113 (an n-type region) of the transfer transistor Tr2 for blue. It is to be noted that a p-type region 113*p* (a hole storage layer) is provided in proximity to an interface between each of ends on the surface S2 side of the p-type region 111*p* and the n-type photoelectric conversion layer 111*n* and the surface S2.

The inorganic photoelectric conversion section 11R may have a configuration in which an n-type photoelectric conversion layer 112*n* (an electron storage layer) is sandwiched between p-type regions 112*p*1 and 112*p*2 (hole storage layers) (may have a p-n-p laminate configuration). The n-type photoelectric conversion layer 112*n* is bent and extends to allow a part thereof to extend to reach an interface with the surface S2. The n-type photoelectric conversion layer 112n is connected to the FD 114 (an n-type region) of the transfer transistor Tr3 for red. It is to be noted that a p-type region 113p (a hole storage layer) is provided at least in proximity to an interface between an end on the surface S2 side of the n-type photoelectric conversion layer 111n and the surface S2.

Figure 4:
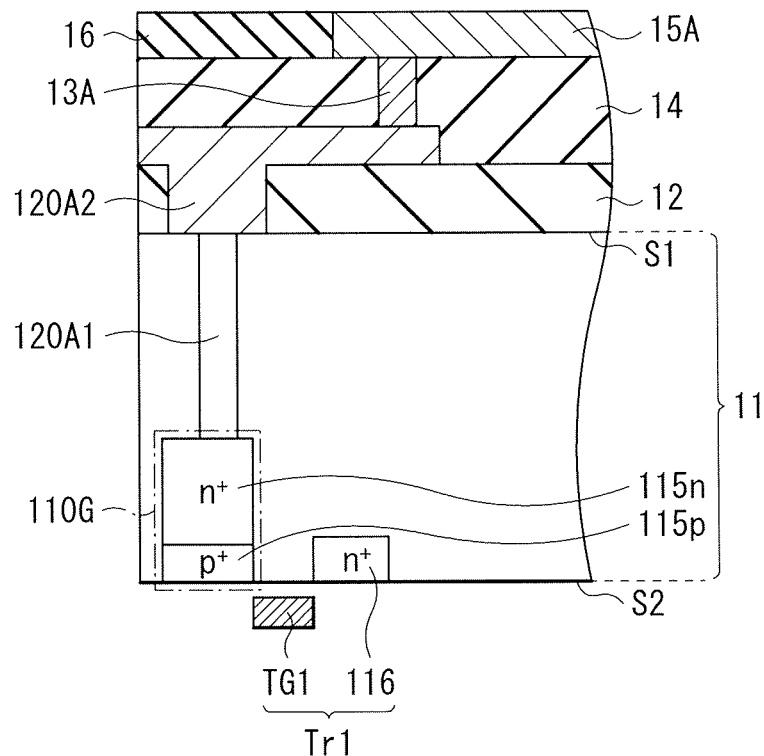
FIG. 4 is a sectional view illustrating a configuration (lower-side drawing of electrons) of a charge (electron) storage layer of the organic photoelectric conversion section illustrated in FIG. 1.

FIG. 4 illustrates a specific configuration example of the green storage layer 110G. It is to be noted that a case where electrons of pairs of electrons and holes generated by the organic photoelectric conversion section 11G are read as signal charges from the lower electrode 15A side will be described here. Moreover, a gate electrode TG1 of the transfer transistor Tr1 of the pixel transistors is also illustrated in FIG. 4.

The green storage layer 110G is configured by including an n-type region 115n serving as an electron storage layer. A part of the n-type region 115n is connected to a conductive plug 120A1, and accumulates electrons transmitted from the lower electrode 15A side through the conductive plug 120A1. The n-type region 115n is also connected to the FD 116 (an n-type region) of the transfer transistor Tr1 for green. It is to be noted that a p-type region 115p (a hole storage layer) is formed in proximity to an interface between the n-type region 115n and the surface S2.

The conductive plugs 120A1 and 120B2 illustrated in FIG. 1 function as connectors between the organic photoelectric conversion section 11G and the semiconductor substrate 11 together with conductive plugs 120A2 and 120B2 that will be described later, and serve as transmission paths for electrons or holes generated in the organic photoelectric conversion section 11G. The conductive plug 120A1 may be brought into conduction with, for example, the lower electrode 15A of the organic photoelectric conversion section 11G, and is connected to the green storage layer 110G. The conductive plug 120B1 is brought into conduction with the upper electrode 18 of the organic photoelectric conversion section 11G, and serves as a wiring line for emitting holes.

Each of these conductive plugs 120A1 and 120B1 may be configured of, for example, a conductive semiconductor layer, and is formed to be embedded in the semiconductor substrate 11. In this case, the conductive plug 120A1 may be of an n type (because the conductive plug 120A1 serves a transmission path for electrons), and the conductive plug 120B1 may be of a p type (because the conductive plug 120B1 serves a transmission path for holes). Alternatively, the conductive plugs 120A1 and 120B1 may be configured, for example, by embedding a conductive film material such as tungsten in a through via. In this case, for example, to reduce a short circuit with silicon, desirably, a via side surface may be covered with an insulating film of silicon oxide ($SiO_2$), silicon nitride (SiN), or the like.

(Multilayer Wiring Layer 51)

The multilayer wiring layer 51 illustrated in FIG. 1 is provided on the surface S2 of the semiconductor substrate 11, and has a configuration in which a plurality of wiring lines 51A are disposed with an interlayer insulating film 52 in between. Thus, in the photoelectric conversion device 10B, the multilayer wiring layer 51 is provided on a side opposite to the light reception surface (the surface S1) of the semiconductor substrate 11; therefore, a so-called back-side illumination type solid-state image pickup unit 1 is achievable. For example, a supporting substrate 53 made of silicon may be bonded to the multilayer wiring layer 51.

(Organic Photoelectric Conversion Section 11G)

The organic photoelectric conversion section 11G illustrated in FIG. 1 is a photoelectric conversion device configured to generate electron-hole pairs by absorbing light in a selective wavelength range (green light in this case) with use of an organic semiconductor. The organic photoelectric conversion section 11G has a configuration in which an organic photoelectric conversion layer 18 is sandwiched between a pair of electrodes (a lower electrode 15A and an upper electrode 19) for drawing signal charges. For example, the lower electrode 15A and the upper electrode 19 are electrically connected to the conductive plugs 120A1 and 120B1 embedded in the semiconductor substrate 11 through a wiring layer and a contact metal layer.

More specifically, in the organic photoelectric conversion section 11G, an interlayer insulating film 12, the conductive plugs 120A2 and 120B2, an interlayer insulating film 14, wiring layers 13A and 13B, the lower electrode 15A and a wiring layer 15B, an insulating film 16, an inorganic oxide layer 17, the organic photoelectric conversion layer 18, the upper electrode 19, a hard mask layer 20, a contact metal layer 21, and a protective film 22 are provided in this order on the surface S1 of the semiconductor substrate 11.

To reduce an interface state of the semiconductor substrate 11 (a silicon layer 110) and to reduce generation of a dark current from an interface with the silicon layer 110, the interlayer insulating film 12 may be desirably configured of an insulating film with a low interface state. As such an insulating film, for example, a laminate film of a hafnium oxide (HfO2) film and a silicon oxide ($SiO_2$) film may be used. However, the material of the interlayer insulating film 12 is not specifically limited.

The conductive plugs 120A2 and 120B2 are provided to regions facing the conductive plugs 120A1 and 120B1, respectively, and are embedded in through holes of the interlayer insulating film 12. As described above, the conductive plug 120A2 functions as a connector together with the conductive plug 120A1, and forms, together with the conductive plug 120A1 and the wiring layer 13A, a transmission path for charges (electrons) from the lower electrode 15A to the green storage layer 110G. As described above, the conductive plug 120B2 functions as a connector together with the conductive plug 120B1, and forms, together with the conductive plug 120B1, the wiring layer 13B, the wiring layer 15B, and the contact metal layer 20, an emission path for charges (holes) from the upper electrode 18. The conductive plugs 120A2 and 120B2 may desirably have, for example, a laminate configuration of a laminate film of titanium (Ti) and titanium nitride (TiN) as a barrier metal and a metal film of tungsten (W) or the like to also function as a light-shielding film. Moreover, such a laminate configuration is desirable, because even in a case where the conductive plugs 120A1 and 120B1 are formed as n-type or p-type semiconductor layers, contact with silicon is allowed to be secured by using such a laminate configuration.

The interlayer insulating film 14 may be configured of, for example, a single-layer film made of one kind of silicon oxide ($SiO_2$), silicon nitride (SiN), silicon oxynitride (SiON), and the like, or a laminate film made of two or more kinds thereof.

The wiring layers 13A and 13B are provided to regions facing the conductive plugs 120A2 and 120B2, respectively, and are embedded in through holes of the interlayer insulating film 14. The wiring layers 13A and 13B may have, for example, a laminate configuration of a TiN film and a W film.

The insulating film 16 is configured to electrically isolate the lower electrode 15A and the wiring layer 15B from each other. Moreover, in a case where the photoelectric conversion device 10B is used as the pixel P of the solid-state image pickup unit 1, the insulating film 16 has a function of electrically isolating the lower electrodes 15A of respective pixels P from one another. The insulating film 16 may be configured of, for example, a single-layer film made of one kind of silicon oxide, silicon nitride, silicon oxynitride (SiON), and the like, or a laminate film made of two or more kinds thereof. For example, a surface of the insulating film 16 may be planarized, and the insulating film 16 has a shape and a pattern having little difference in level with the lower electrode 15A and the wiring layer 15B.

The lower electrode 15A is provided to a region directly facing and covering light reception surfaces of the inorganic photoelectric conversion sections 11B and 11R formed in the semiconductor substrate 11. The lower electrode 15A may be configured of a conductive film having light transmittance, for example, ITO (indium tin oxide). As the material of the lower electrode 15A, in addition to this ITO, a tin oxide ($SnO_2$)-based material doped with a dopant, or a zinc oxide (ZnO)-based material doped with a dopant may be used. Examples of the zinc oxide-based material may include aluminum zinc oxide (ZnO doped with aluminum (Al) as a dopant, for example, AZO), gallium zinc oxide (ZnO doped with gallium (Ga) as a dopant, for example, GZO), and indium zinc oxide (ZnO doped with indium (In) as a dopant, for example, IZO). Moreover, in addition to them, CuI, $InSbO_4$, ZnMgO, $CuInO_2$, $MgIn_2O_4$, CdO, $ZnSnO_3$, and the like may be used. It is to be noted that in this embodiment, as described above, signal charges (electrons) are drawn from the lower electrode 15A; therefore, in the solid-state image pickup unit that uses the photoelectric conversion devices 10B as pixels and will be described later, the lower electrodes 15A of respective pixels are formed to be isolated from one another.

The wiring layer 15B is provided to a region facing the wiring layer 13B, and is electrically isolated from the lower electrode 15A by the insulating film 16.

The lower electrode 15A includes a reduced layer 15D in a part in a thickness direction from an interface 15C on the organic photoelectric conversion layer 18 side. Likewise, the wiring layer 15B also has the reduced layer 15D in a part in the thickness direction from the interface 15C on the organic photoelectric conversion layer 18 side. The reduced layer 15D will be described later.

The inorganic oxide layer 17 has a function as a hole block layer, and is provided between the reduced layer 15A and the organic photoelectric conversion layer 18. The inorganic oxide layer 17 may have, for example, a thickness of 30 nm or less, and is configured of one or more kinds of a group configured of tantalum oxide, molybdenum oxide, vanadium oxide, tungsten oxide, hafnium oxide, and cesium oxide.

The organic photoelectric conversion layer 18 is provided on the inorganic oxide layer 17, and is configured of an organic film made of an organic semiconductor that performs photoelectric conversion on light in a selective wavelength range and allows light in a wavelength range other than the selective wavelength range to pass therethrough. The organic semiconductor may be desirably configured by including one or both of an organic p-type semiconductor and an organic n-type semiconductor. As such an organic semiconductor, one kind of a quinacridone derivative, a naphthalene derivative, an anthracene derivative, a phenanthrene derivative, a tetracene derivative, a pyrene derivative, a perylene derivative, and a fluoranthene derivative may be preferably used. Alternatively, a polymer such as phenylenevinylene, fluorene, carbazole, indole, pyrene, pyrrole, picoline, thiophene, acetylene, or diacetylene, or a derivative thereof may be used. In addition, a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, an anthraquinone-based dye, a chain compound prepared by fusing a fused polycyclic aromatic group such as anthracene or pyrene and an aromatic ring or a heterocyclic compound, quinoline having a squarylium group and a croconic methine group as a joining chain, two nitrogen-containing heterocyclic rings such as benzothiazole and benzoxazole, a cyanine-like dye bonded by a squarylium group and a croconic methine group, or the like may be preferably used. It is to be noted that as the above-described metal complex dye, a dithiol metal complex-based dye, a metal phthalocyanine dye, a metal porphyrin dye, or a ruthenium complex dye may be preferable; however, the metal complex dye is not limited thereto. In this embodiment, the organic photoelectric conversion layer 18 is capable of performing photoelectric conversion on, for example, green light corresponding to a part of a whole of a wavelength range of 495 nm to 570 nm. The thickness of such an organic photoelectric conversion layer 18 may be, for example, 50 nm to 500 nm.

In addition to the inorganic oxide layer 17, any other layer such as a under coat film that is not illustrated may be provided between the organic photoelectric conversion layer 18 and the lower electrode 15A. Moreover, any other layer such as an electron block layer and a buffer layer that are not illustrated may be provided between the organic photoelectric conversion layer 18 and the upper electrode 19.

The upper electrode 19 is provided on the organic photoelectric conversion layer 18, and is made of the same transparent conductive material as that of the lower electrode 15A. In this embodiment, as described above, holes drawn from the upper electrode 19 are emitted; therefore, in the solid-state image pickup unit that uses the photoelectric conversion devices 10 as pixels and will be described later, the upper electrodes 19 of respective pixels may be isolated from each other, or the upper electrode 19 may be formed as a common electrode for the respective pixels. The thickness of the upper electrode 19 may be, for example, 10 nm to 200 nm.

The hard mask layer 20 may be preferably transparent, and may be made of, for example, silicon nitride (SiN), silicon oxide ($SiO_2$), silicon oxynitride (SiON), or aluminum oxide ($Al_2O_3$). The hard mask layer 20 has a single-layer film made of one kind thereof, or a laminate configuration of two or more layers including these materials.

The contact metal layer 21 is embedded in a contact hole H provided to the hard mask layer 20, and is connected to the upper electrode 19 as well as extends to a top surface of the wiring layer 15B. The contact metal layer 21 may be configured of, for example, any one of titanium, tungsten, titanium nitride, aluminum, and the like, or a laminate film made of two or more kinds thereof.

The protective film 22 is provided on the hard mask layer 20 and the contact metal layer 21. The protective film 22 is made of a material with light transmittance, and may be, for example, a single-layer film made of any one kind of silicon oxide ($SiO_2$), silicon nitride (SiN), silicon oxynitride, and the like, or a laminate film made of two or more kinds thereof. The thickness of the protective film 19 may be, for example, 100 nm to 30000 nm.

A planarization film 23 is provided on an entire surface of the protective film 22. An on-chip lens 24 (a microlens) is provided on the planarization film 23. The on-chip lens 24 is configured to condense light incident thereon from above on the light reception surfaces of the organic photoelectric conversion layer 11G and the inorganic photoelectric conversion layers 11B and 11R. In this embodiment, since the multilayer wiring layer 51 is formed on the surface S2 side of the semiconductor substrate 11, the light reception surfaces of the organic photoelectric conversion section 11G, and the inorganic photoelectric conversion sections 11B and 11R are allowed to be arranged close to one another, and variation in sensitivity between respective colors caused depending on the f-number of the on-chip lens 24 is allowed to be reduced.

It is to be noted that in the photoelectric conversion device 10, signal charges (electrons) are drawn from the lower electrode 15A; therefore, in the solid-state image pickup unit using the photoelectric conversion devices 10 as pixels, as described above, the upper electrode 19 may serve as a common electrode. In this case, a transmission path configured of the contact hole H, the contact metal layer 21, the wiring layers 15B and 13B, and the conductive plugs 120B1 and 120B2 that are described above may be formed in one or more positions for all of the pixels.

Figure 5:
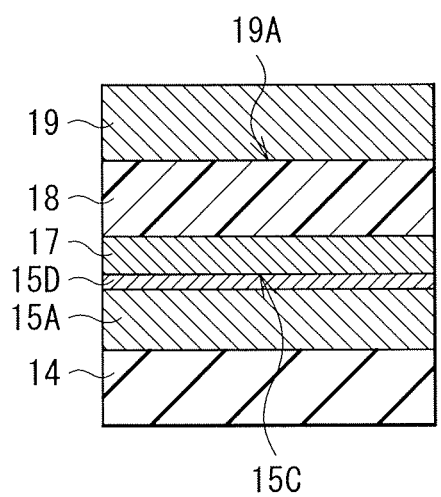
FIG. 5 is a sectional view illustrating a main part of the photoelectric conversion device illustrated in FIG. 1.

FIG. 5 illustrates a main-part configuration of the photoelectric conversion device 10 illustrated in FIG. 1. The upper electrode 19 and the lower electrode 15A may be made of the same transparent conductive material, for example, ITO. An oxygen amount at the interface 15C on the organic photoelectric conversion layer 18 side of the lower electrode 15A (i.e., an oxygen amount of the reduced layer 15D) is smaller than an oxygen amount at an interface 19A on the organic photoelectric conversion layer 18 side of the upper electrode 19. Therefore, in the photoelectric conversion device 10, a work function is allowed to be adjusted without reducing light transmittance of electrodes.

Here, in this embodiment, the lower electrode 15A corresponds to a specific example of "first electrode" in the present disclosure. The upper electrode 19 corresponds to a specific example of "second electrode" in the present disclosure. The organic photoelectric conversion layer 18 corresponds to a specific example of "functional layer" in the present disclosure.

Figure 6:
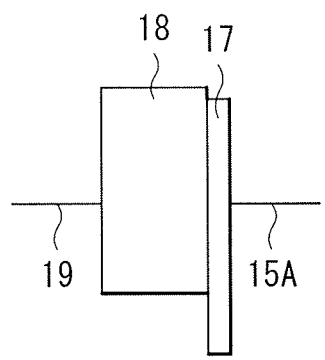
FIG. 6 is a band diagram illustrating a case where work functions of an upper electrode and a lower electrode are equal to each other.

In other words, in a case where the upper electrode 19 and the lower electrode 15A are made of the same transparent conductive material, for example, ITO, as illustrated in FIG. 6, work functions of the upper electrode 19 and the lower electrode 15 are equal to each other, thereby causing a state in which an internal electric field is not applied.

Figure 7:
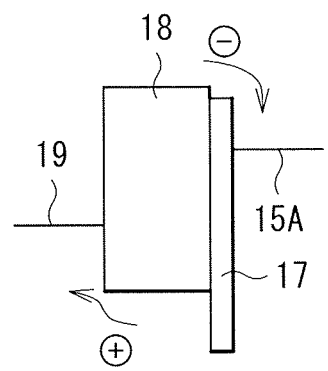
FIG. 7 is a band diagram illustrating a case where the work function of the upper electrode is high and the work function of the lower electrode is low.

Desirably, as illustrated in FIG. 7, while the upper electrode 19 and the lower electrode 15A are made of the same transparent conductive material, effective work functions of respective electrodes may be adjusted to allow the work function of the upper electrode 19 and the work function of the lower electrode 15A to be high and low, respectively. By doing so, a desired internal electric field is allowed to be applied with use of the same material for the upper electrode 19 and the lower electrode 15A, electrons are easily drawn from the lower electrode 15A, and an improvement in sensitivity is allowed to be expected. Moreover, reduction in the work function of the lower electrode 15A is effective for reduction in a dark current. Further, since the same electrode material is used, the upper electrode 19 and the lower electrode 15A are allowed to be formed with use of a same manufacturing apparatus, and cost reduction is allowed to be expected.

Therefore, in the photoelectric conversion device 10, the reduced layer 15D with a smaller oxygen amount than that at the interface 19A of the upper electrode 19 is provided in proximity to the interface 15C of the lower electrode 15A. Accordingly, the effective work function of the lower electrode 15A (the work function of the interface 15C) is allowed to be adjusted to be lower than the effective work function of the upper electrode 19 (the work function of the interface 19A) without impairing light transmittance of the lower electrode 15A.

For example, the photoelectric conversion device 10 may be manufactured as follows.

Figure 19:
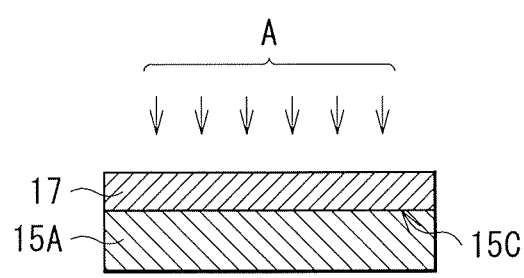
FIG. 19 is a sectional view illustrating a process following FIG. 18.
Figure 20:
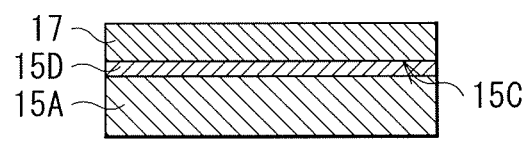
FIG. 20 is a sectional view illustrating a process following FIG. 19.

FIGS. 8 to 25 illustrate a method of manufacturing the photoelectric conversion device 10 in process order. It is to be noted that FIGS. 19 and 20 illustrate only a main-part configuration of the photoelectric conversion device 10.

Figure 8:
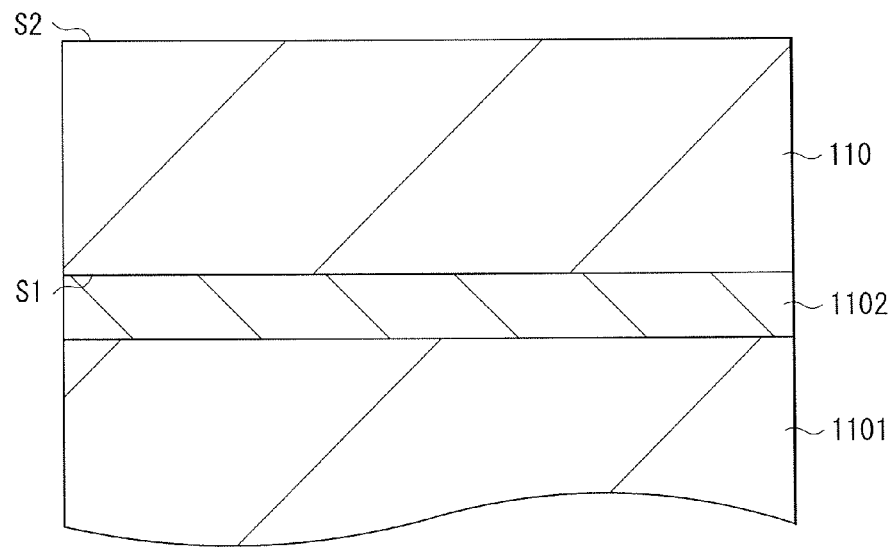
FIG. 8 is a sectional view illustrating a method of manufacturing the photoelectric conversion device illustrated in FIG. 1 in process order.

First, the semiconductor substrate 11 is formed. More specifically, as illustrated in FIG. 8, a so-called SOI substrate configured by forming a silicon layer 110 on a silicon base 1101 with a silicon oxide film 1102 in between is prepared. It is to be noted that a surface on the silicon oxide film 1102 side of the silicon layer 110 serves as the back surface (the surface S1) of the semiconductor substrate 11. FIGS. 8 to 11 illustrate a state in which a configuration illustrated in FIG. 1 is vertically inverted.

Figure 9:
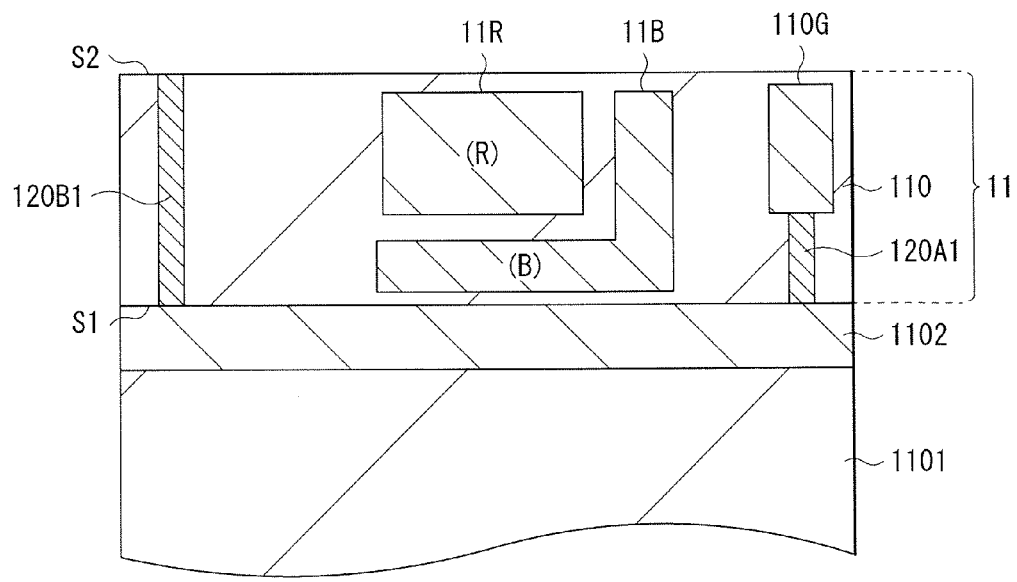
FIG. 9 is a sectional view illustrating a process following FIG. 8.

Next, as illustrated in FIG. 9, the conductive plugs 120A1 and 120B1 are formed on the silicon layer 110. At this time, the conductive plugs 120A1 and 120B1 are allowed to be formed by forming through vias in, for example, the silicon layer 110, and then embedding a barrier metal such as the above-described silicon nitride and tungsten in the through vias. Alternatively, a conductive extrinsic semiconductor layer may be formed by, for example, ion implantation on the silicon layer 110. In this case, the conductive plug 120A1 is formed as an n-type semiconductor layer, and the conductive plug 120B1 is formed as a p-type semiconductor layer. After that, the inorganic photoelectric conversion sections 11B and 11R having, for example, the p-type region and the n-type region illustrated in FIGS. 2 and 3, respectively, are formed by ion implantation in regions located at depths different from each other in the silicon layer 110 (to be superimposed on each other). Moreover, in a region adjacent to the conductive plug 120A1, the green storage layer 110G is formed by ion implantation. Thus, the semiconductor substrate 11 is formed.

It is to be noted that, after that, although not illustrated, the pixel transistors including the transfer transistors Tr1 to Tr3 and the peripheral circuit section including the logic circuit and the like are formed on the surface S2 side of the semiconductor substrate 11.

Figure 10:
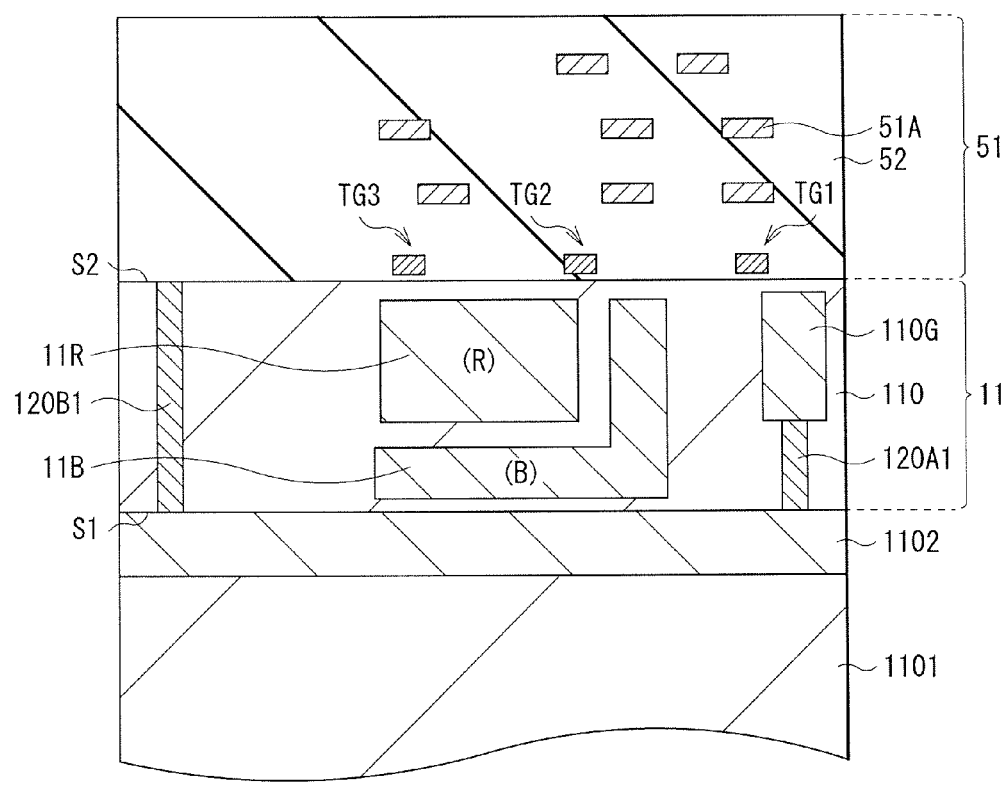
FIG. 10 is a sectional view illustrating a process following FIG. 9.

Next, as illustrated in FIG. 10, the multilayer wiring layer 51 is formed by forming a plurality of layers of wiring lines 51A on the surface S2 of the semiconductor substrate 11 with the interlayer insulating film 52 in between.

Figure 11:
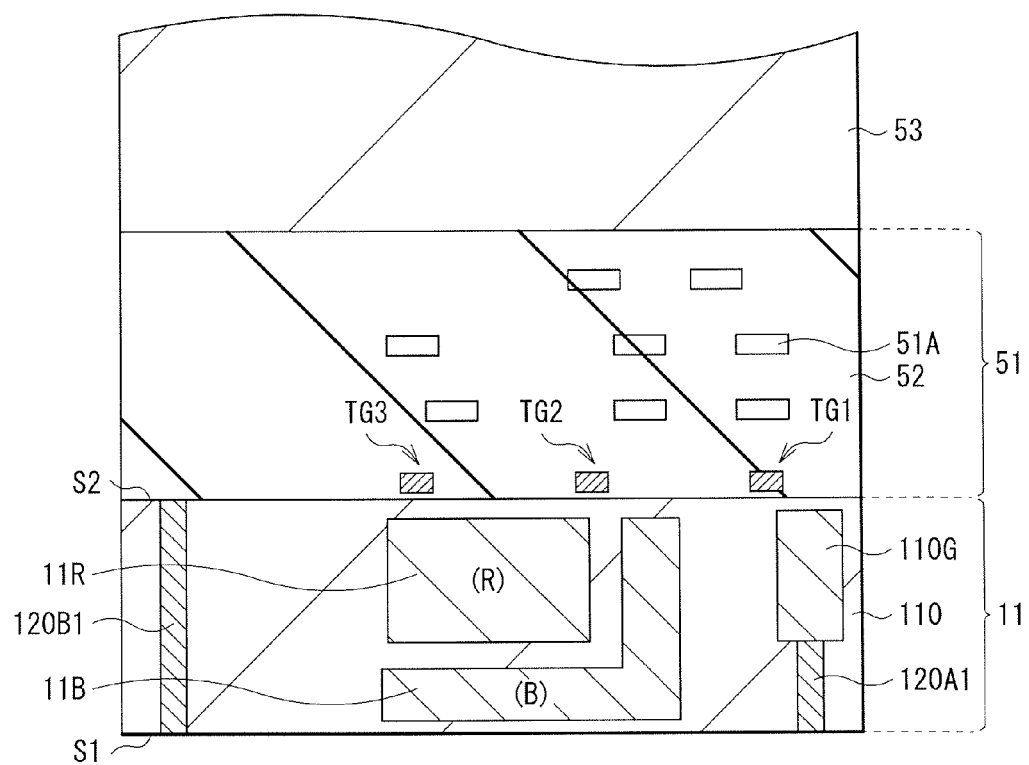
FIG. 11 is a sectional view illustrating a process following FIG. 10.
Figure 12:
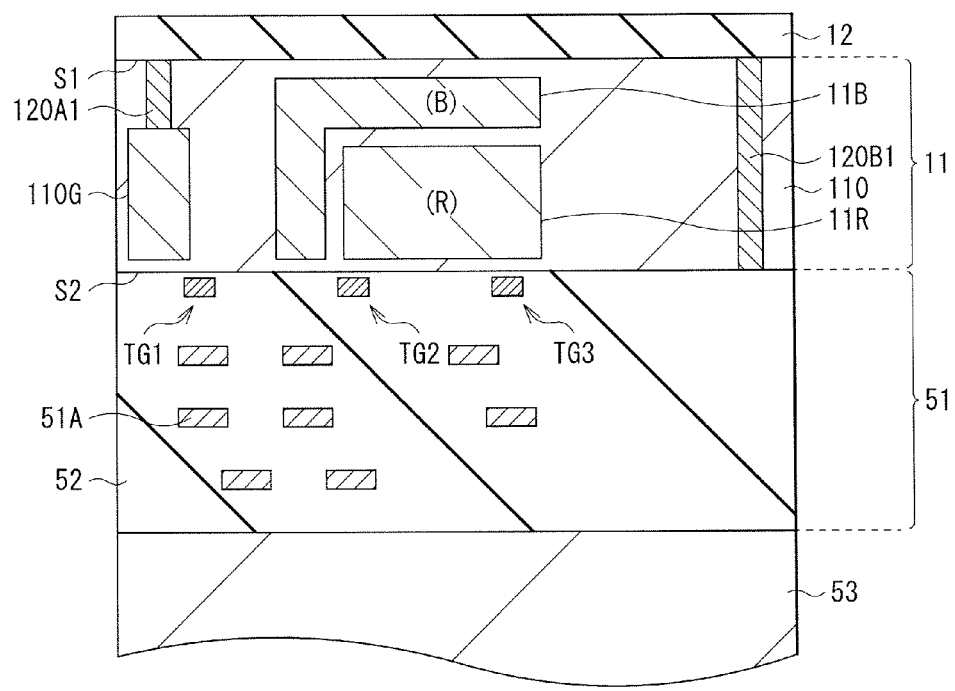
FIG. 12 is a sectional view illustrating a process following FIG. 11.
Figure 13:
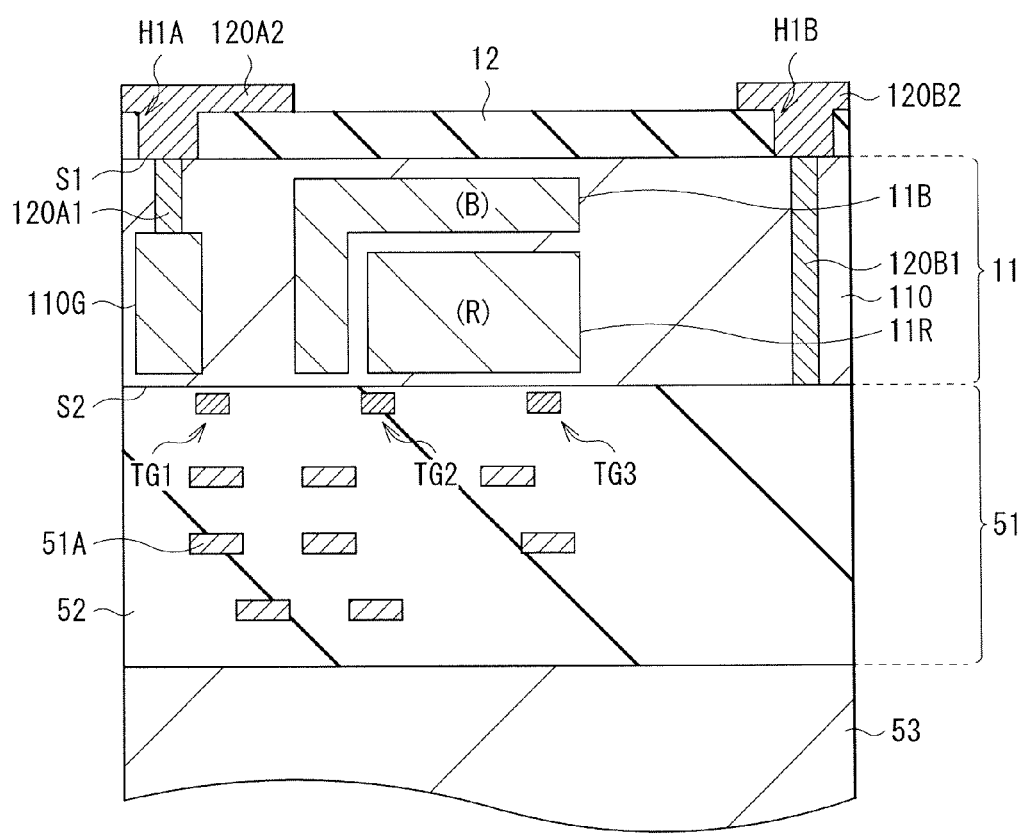
FIG. 13 is a sectional view illustrating a process following FIG. 12.

After that, as illustrated in FIG. 11, the supporting substrate 53 made of silicon is bonded on the multilayer wiring layer 51. After that, the silicon base 1101 and the silicon oxide film 1102 are peeled from the surface S1 side of the semiconductor substrate 11 to expose the surface S1 of the semiconductor substrate 11.

Figure 14:
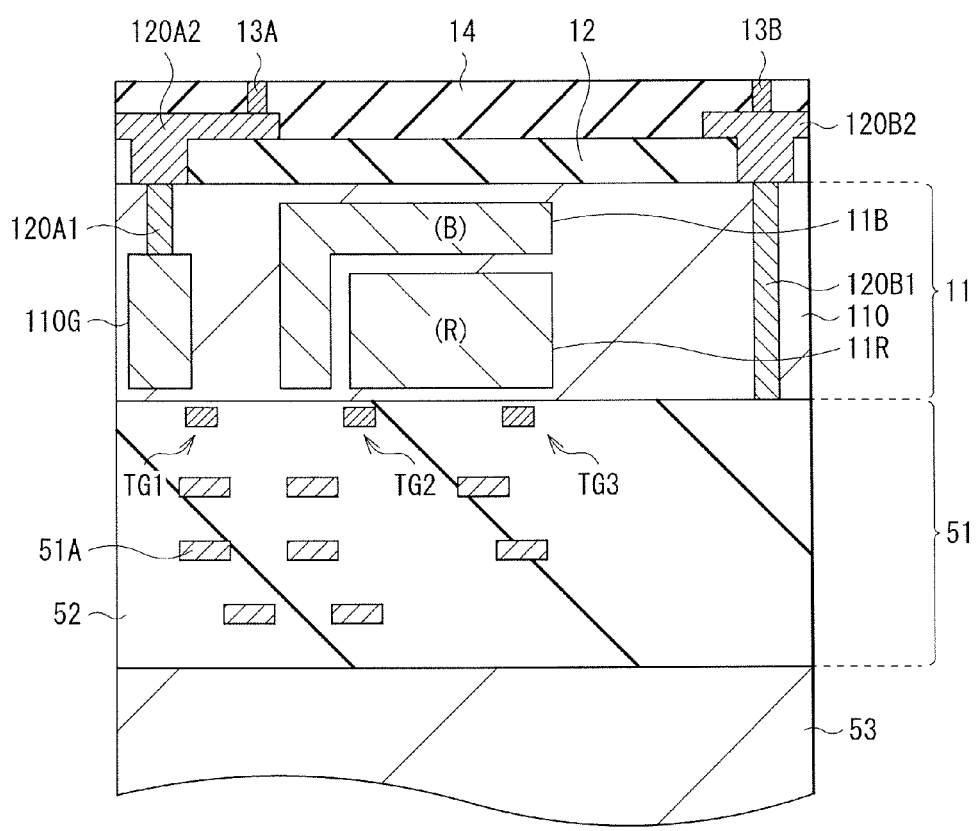
FIG. 14 is a sectional view illustrating a process following FIG. 13.

After the supporting substrate 53 is bonded to the multilayer wiring layer 51, the organic photoelectric conversion section 11G is formed on the surface S1 of the semiconductor substrate 11. More specifically, first, as illustrated in FIG. 14, the interlayer insulating film 12 configured of a laminate film of the above-described hafnium oxide film and the above-described silicon oxide film is formed on the surface S1 of the semiconductor substrate 11. For example, after the hafnium oxide film is formed by an ALD (atomic layer deposition) method, the silicon oxide film is formed by, for example, a plasma CVD (Chemical Vapor Deposition) method. However, the material and the forming method of the interlayer insulating film 12 are not specifically limited.

Figure 15:
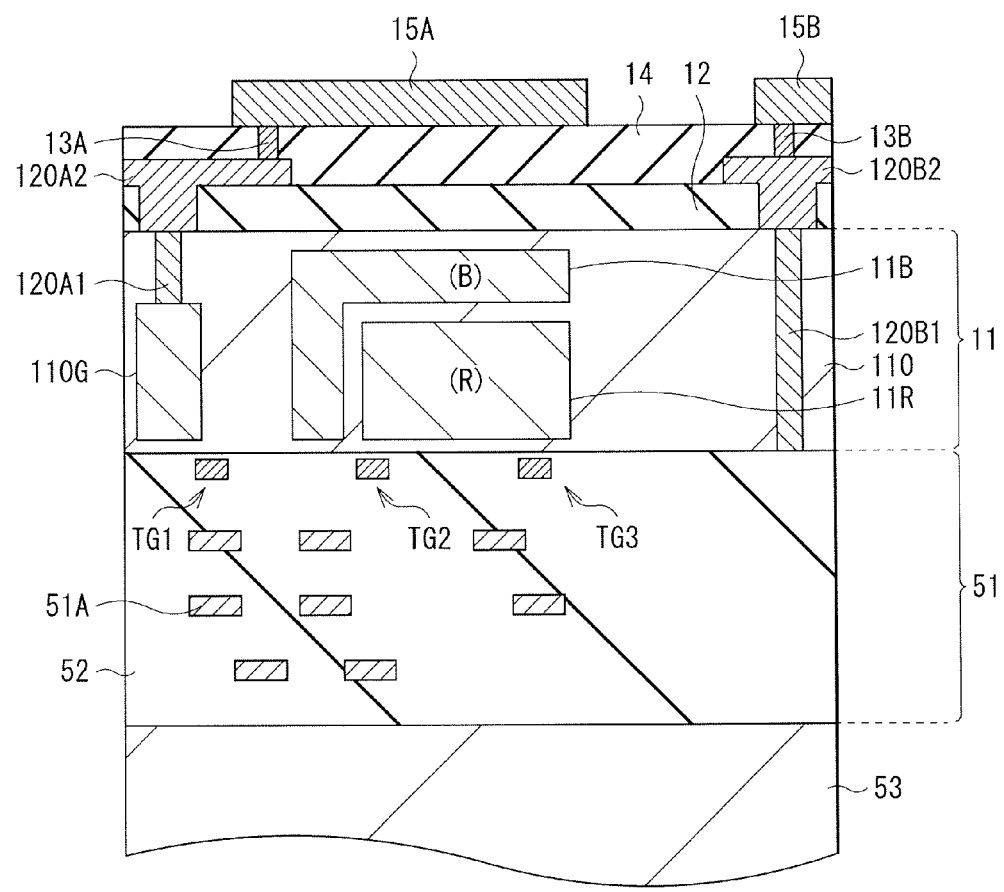
FIG. 15 is a sectional view illustrating a process following FIG. 14.

After the interlayer insulating film 12 is formed, as illustrated in FIG. 15, contact holes H1A and H1B are provided in positions facing the conductive plugs 120A1 and 120B1 of the interlayer insulating film 12. The contact holes H1A and H1B are filled with the conductive plugs 120A2 and 120B2 made of the above-described material. At this time, the conductive plugs 120A2 and 120B2 may be formed to be overhung from the inside of the contact holes H1A and H1B to a top surface of the interlayer insulating film 12, thereby covering a region that is to be light-shielded on the interlayer insulating film 12. Alternatively, a light-shielding layer (not illustrated) may be separately formed in a region isolated from the conductive plugs 120A2 and 120B2 on the interlayer insulating film 12.

Figure 16:
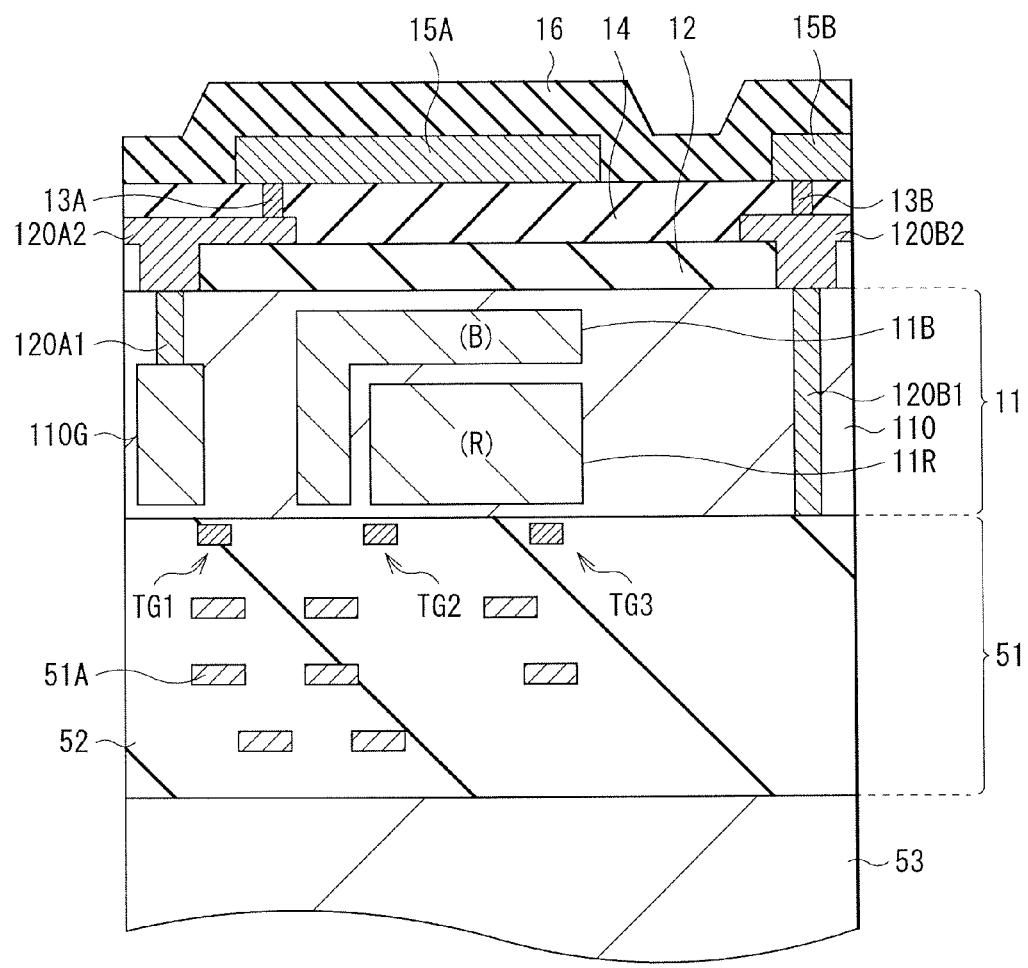
FIG. 16 is a sectional view illustrating a process following FIG. 15.

After the conductive plugs 120A2 and 120B2 are formed, as illustrated in FIG. 16, the interlayer insulating film 14 made of the above-described material is formed by, for example, a plasma CVD method. It is to be noted that after film formation, a front surface of the interlayer insulating film 14 may be desirably planarized by, for example, a CMP (Chemical Mechanical Polishing) method. Next, contact holes are formed in positions facing the conductive plugs 120A2 and 120B2 of the interlayer insulating film 14, and the wiring layers 13A and 13B made of the above-described material are formed in the contact holes. The wiring layers 13A and 13B are formed by forming, for example, a laminate film configured of a TiN film and a W film, and then removing a surplus wiring layer material (TiN, W, and the like) on the interlayer insulating film 14.

Figure 17:
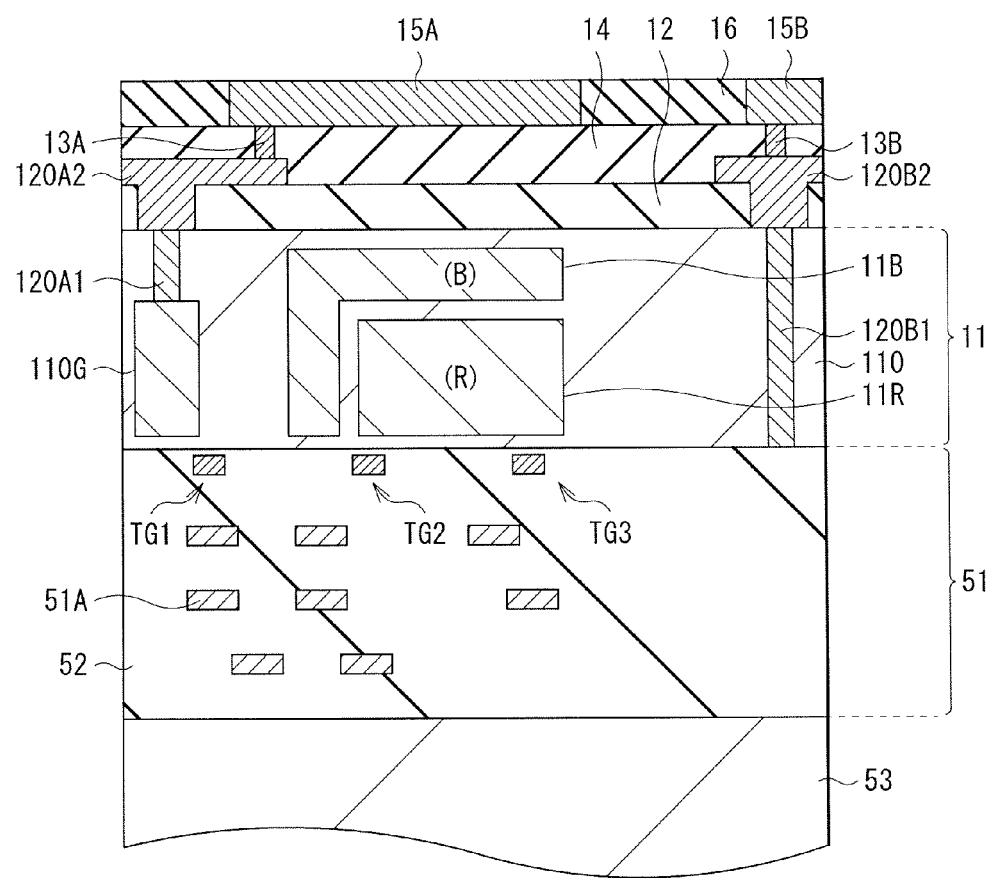
FIG. 17 is a sectional view illustrating a process following FIG. 16.

After the interlayer insulating film 14 and the wiring layers 13A and 13B are formed, as illustrated in FIG. 17, the lower electrode 15A is formed on the interlayer insulating film 14. More specifically, first, a transparent conductive film (not illustrated) made of the above-described material such as ITO is formed on the entire surface of the interlayer insulating film 14 by, for example, a sputtering method. After that, patterning is performed with use of a photolithography method, and the transparent conductive film is processed with use of, for example, dry etching or wet etching. At this time, the lower electrode 15A is formed in a region facing the wiring layer 13A. Moreover, in processing of the transparent conductive film, the wiring layer 15B configuring a part of a hole transmission path is formed concurrently with the lower electrode 15A by allowing the transparent conductive film to remain also in a region facing the wiring layer 13B.

After the lower electrode 15A and the wiring layer 15B are formed, the insulating film 16 is formed. At this time, first, as illustrated in FIG. 16, the insulating film 16 made of the above-described material is formed by, for example, a plasma CVD method on the entire surface of the semiconductor substrate 11 to cover the interlayer insulating film 14, the lower electrode 15A, and the wiring layer 15B. Next, as illustrated in FIG. 17, the lower electrode 15A and the wiring layer 15B are exposed from the insulating film 16 by polishing the formed insulating film 16 by, for example, a CMP method.

Figure 18:
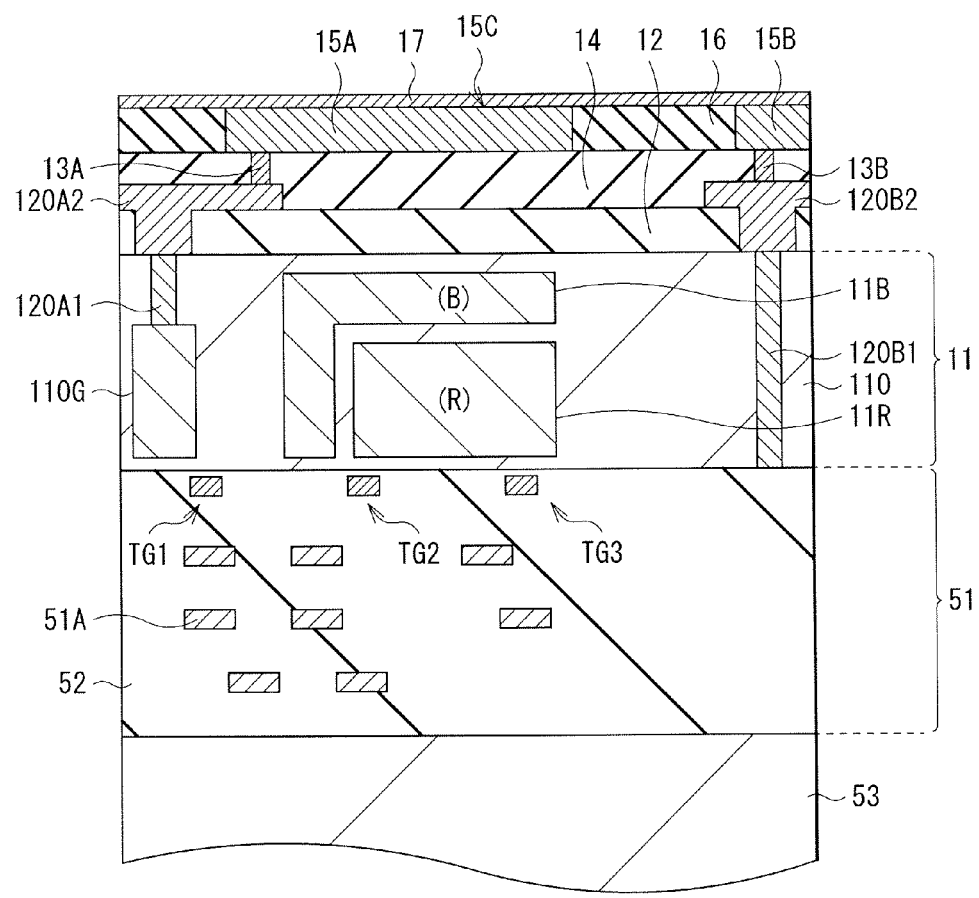
FIG. 18 is a sectional view illustrating a process following FIG. 17.

After the insulating film 16 is formed, as illustrated in FIG. 18, the inorganic oxide layer 17 with a higher metal content ratio than that in an ideal composition is formed as the hole block layer. More specifically, for example, tantalum oxide is formed as the inorganic oxide layer 17 by, for example, a sputtering method to be tantalum-richer than a $Ta_2O_5$ composition (ideal composition) (TaxOy, x/y>0.4).

Figure 21:
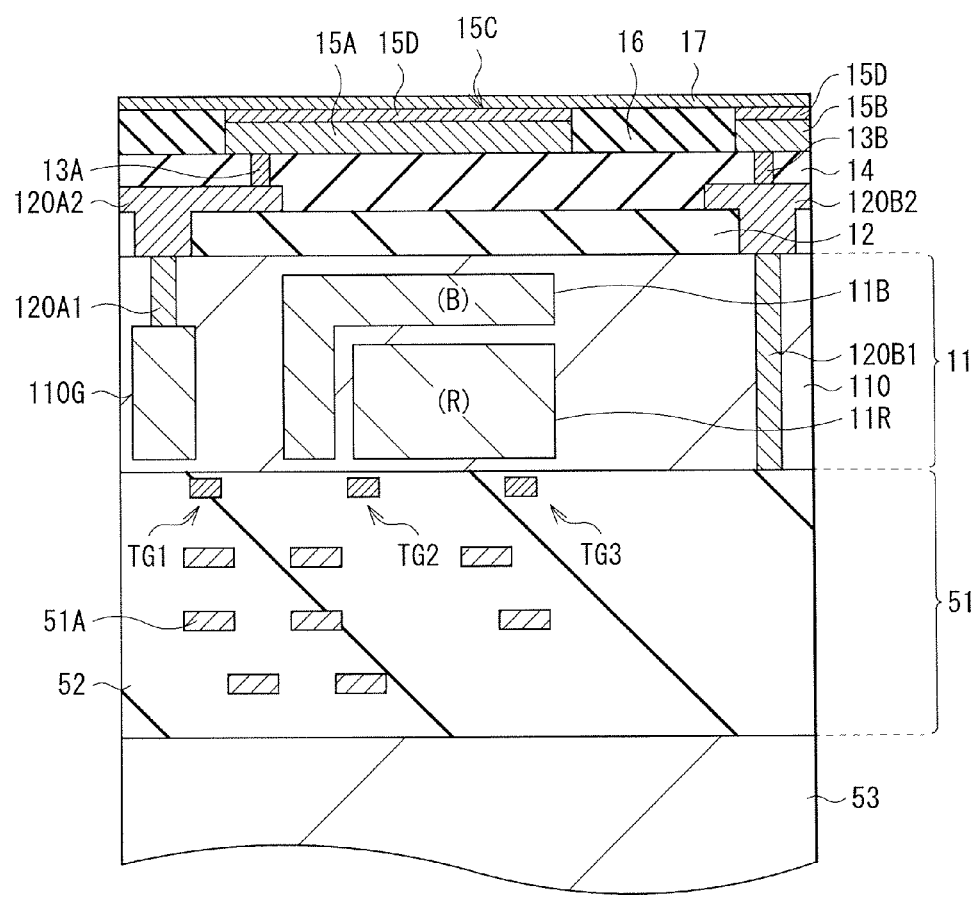
FIG. 21 is a sectional view illustrating a process following FIG. 20.

After the inorganic oxide layer 17 is formed, as illustrated in FIG. 19, annealing treatment A at, for example, 200° C. to 450° C. is performed. Thus, the metal-rich inorganic oxide layer 17 reduces the lower electrode 15A, and as illustrated in FIG. 20, the reduced layer 15D is formed in a part (for example, to a depth of 10 nm to 20 nm) in the thickness direction from the interface 15C of the lower electrode 15A. The oxygen amount of the reduced layer 15D is smaller than the oxygen amount of the transparent conductive material forming the lower electrode 15A. It is to be noted that, as illustrated in FIG. 21, the reduced layer 15D is also formed in a part in the thickness direction from the interface 15C of the wiring layer 15B in a similar manner.

Incidentally, it is known that ITO is allowed to increase a work function by oxidation treatment and to decrease the work function by reduction treatment. However, there are concerns such as reduction in transmittance caused by reducing atmosphere treatment such as annealing with a forming gas (refer to NPTL 1). Moreover, in a case where an inorganic oxide is used as the hole block layer, an ITO surface is oxidized by oxygen during film formation to increase the work function; therefore, it is difficult to apply a desired internal electric field by adjusting the work function with the same electrode material.

In this embodiment, the inorganic oxide layer 17 with a higher metal content ratio than that in the ideal composition is formed, and a part in the thickness direction from the interface 15C of the lower electrode 15A is reduced to form the reduced layer 15D with a small oxygen amount. Therefore, the reduced layer 15D with a small oxygen amount and a low work function is allowed to be formed without reducing the transmittance of the lower electrode 15A.

Figure 22:
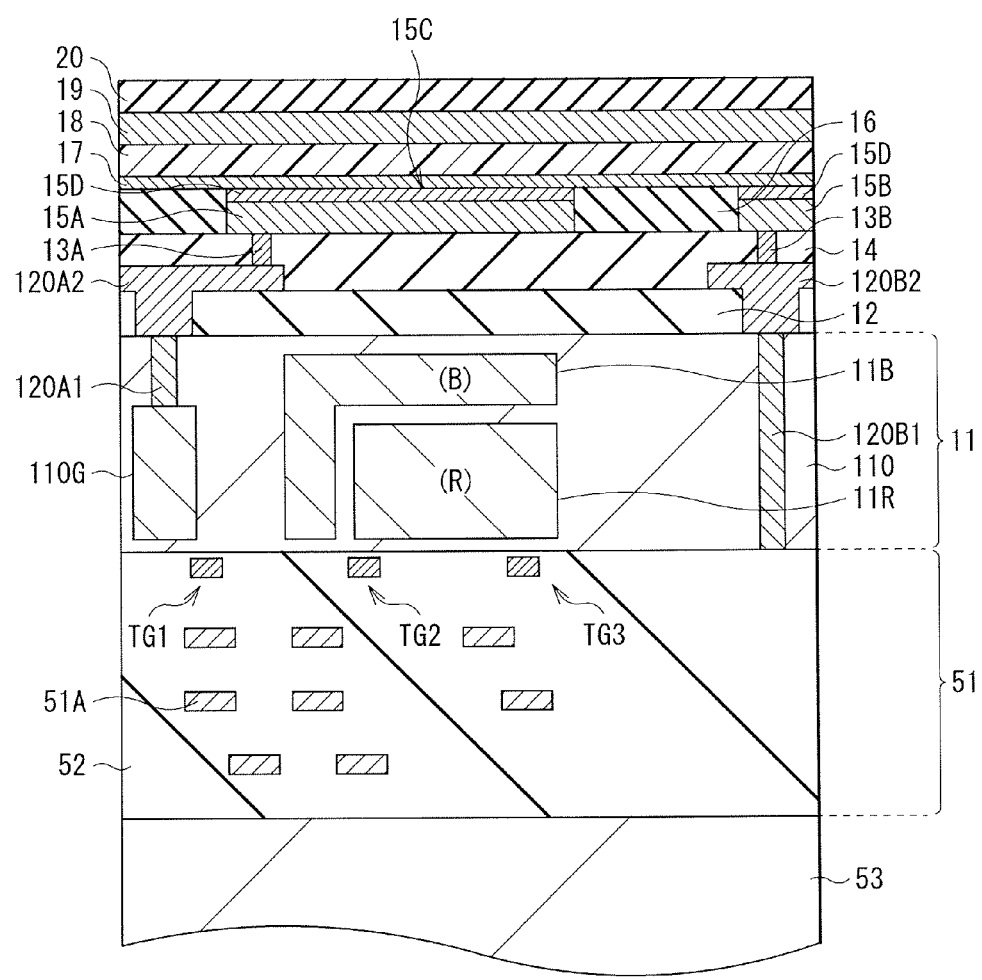
FIG. 22 is a sectional view illustrating a process following FIG. 21.

After the reduced layer 15D is formed, as illustrated in FIG. 22, the organic photoelectric conversion layer 18 is formed on the inorganic oxide layer 17. At this time, a photoelectric conversion material made of the above-described material is pattern-formed by, for example, a vacuum deposition method using a metal mask. For example, a film of a quinacridone derivative may be formed by a vacuum deposition method. It is to be noted that, as described above, when other organic layers (a electron blocking layer and the like) are formed above or below the organic photoelectric conversion layer 18, the respective layers may be desirably formed with use of a same metal mask in succession in a vacuum process (in a multi-chamber process). Moreover, the method of forming the organic photoelectric conversion layer 18 is not necessarily limited to the above-described technique using the metal mask, and any other technique, for example, printing technology or the like may be used.

After the organic photoelectric conversion layer 18 is formed, also as illustrated in FIG. 22, the upper electrode 19 made of the same transparent conductive material as that of the lower electrode 15A is formed by, for example, a vacuum deposition method or a sputtering method. It is to be noted that the organic photoelectric conversion film 18 has properties that easily vary by influences of water, oxygen, hydrogen, and the like; therefore, the upper electrode 19 may be desirably formed together with the organic photoelectric conversion film 18 by the multi-chamber process.

After the upper electrode 19 is formed, also as illustrated in FIG. 22, the hard mask layer 20 made of the above-described material is formed.

Figure 23:
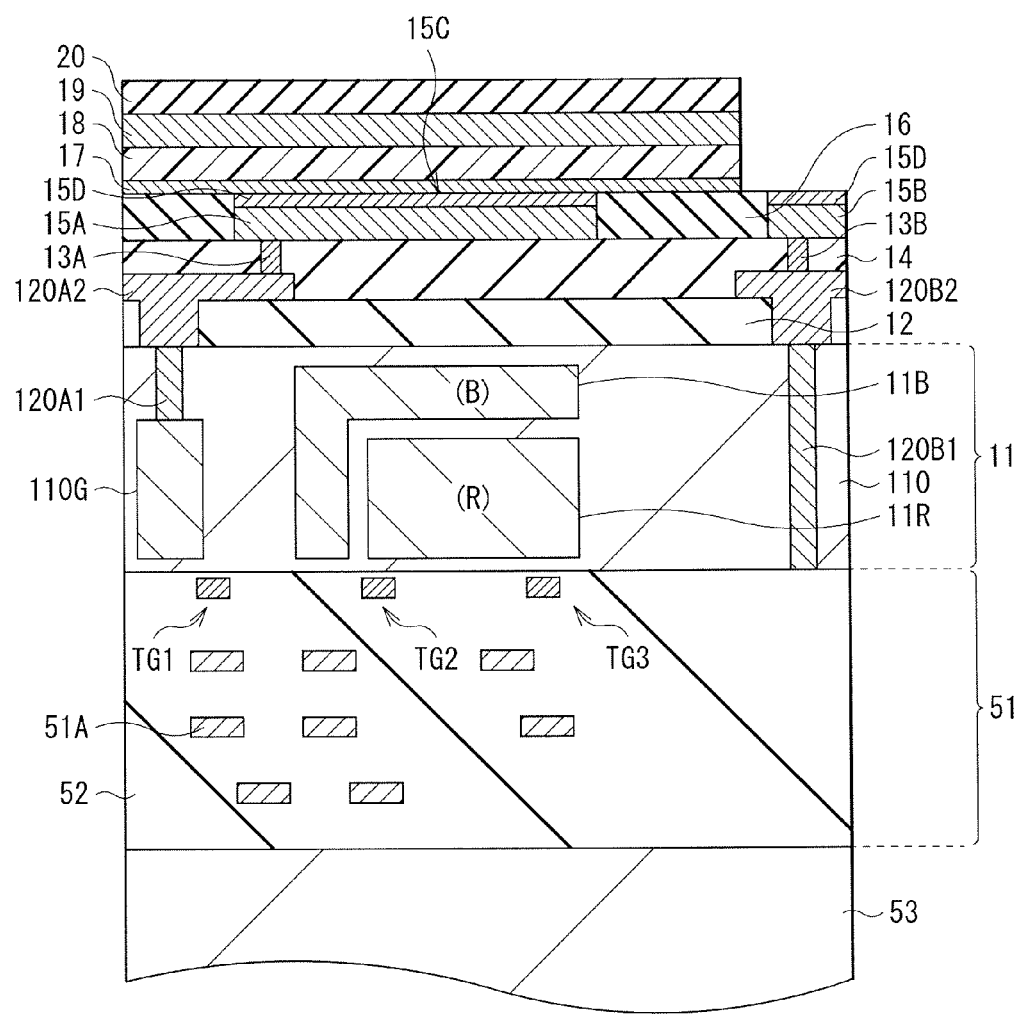
FIG. 23 is a sectional view illustrating a process following FIG. 22.

After that, as illustrated in FIG. 23, patterning is performed with use of, for example, photolithography technology, the hard mask layer 20, the upper electrode 19, the organic photoelectric conversion layer 18, and the inorganic oxide layer 17 are processed with use of dry etching, and post-processing such as ashing is performed to remove a deposit and a residue. It is to be noted that a method of patterning the upper electrode 19, the organic photoelectric conversion layer 18, and the inorganic oxide layer 17 is not specifically limited, and they may be pattern-formed, for example, by forming films with use of a metal mask.

Figure 24:
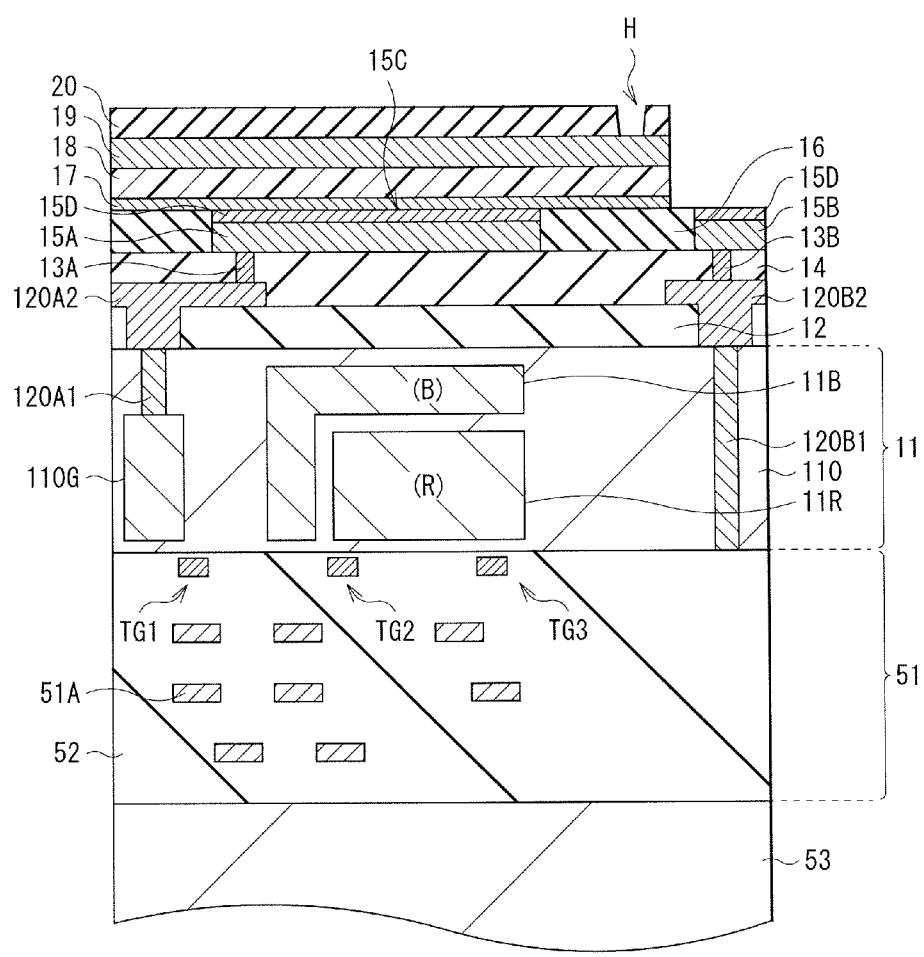
FIG. 24 is a sectional view illustrating a process following FIG. 23.
Figure 25:
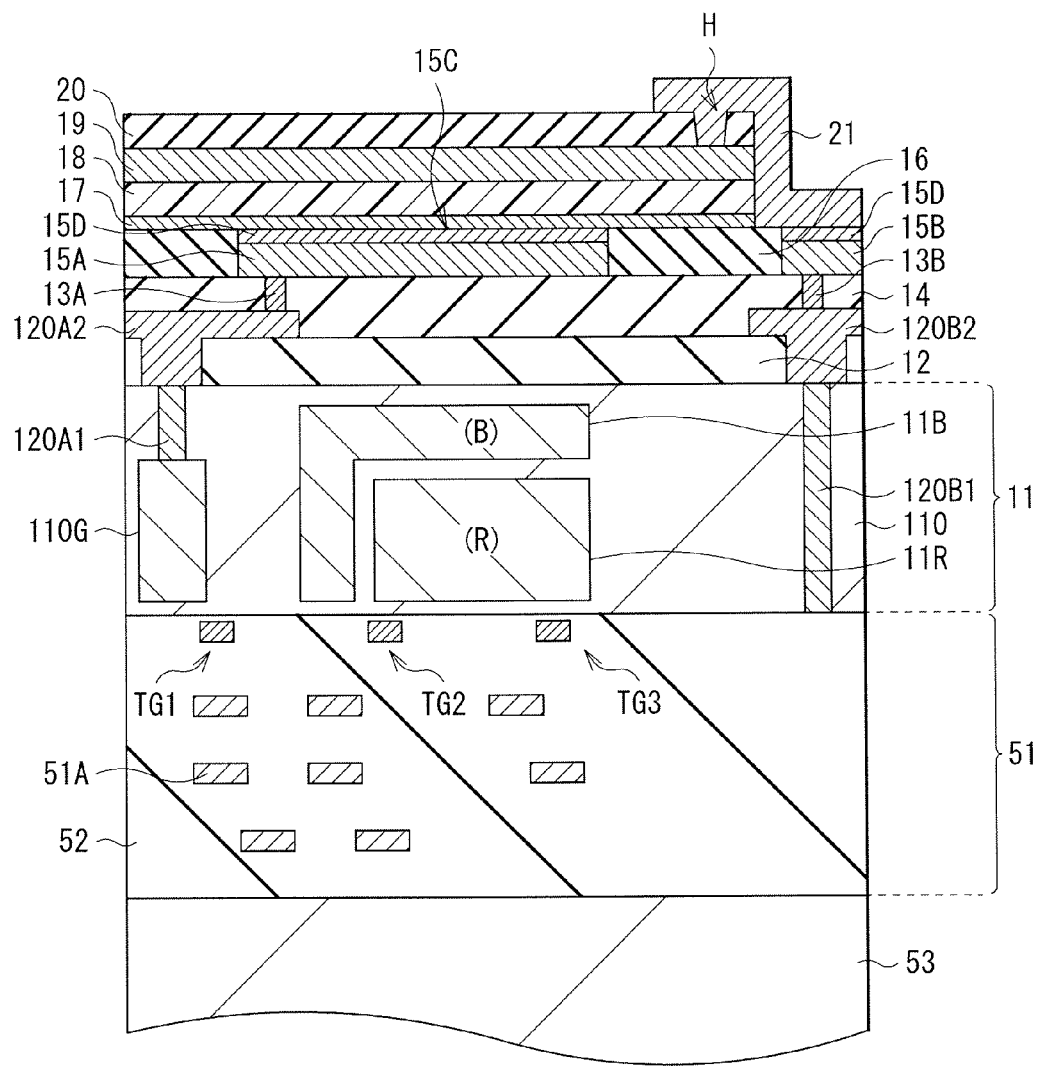
FIG. 25 is a sectional view illustrating a process following FIG. 24.

After the hard mask layer 20, the upper electrode 19, the organic photoelectric conversion layer 18, and the inorganic oxide layer 17 are processed, as illustrated in FIG. 24, the contact hole H is provided to the hard mask layer 20 by, for example, etching with use of a photolithography method. Next, as illustrated in FIG. 25, the contact metal layer 21 is formed by, for example, a sputtering method. It is to be noted that the contact metal layer 21 is formed on the hard mask layer 20 to be embedded in the contact hole H and extend to the top surface of the wring layer 15B.

Finally, although not illustrated, after the protective film 22 and the planarization film 23 are formed on the entire surface of the semiconductor substrate 11, the on-chip lens 24 is formed on the planarization film 23. Thus, the photoelectric conversion device 10 illustrated in FIG. 1 is completed.

Figure 26:
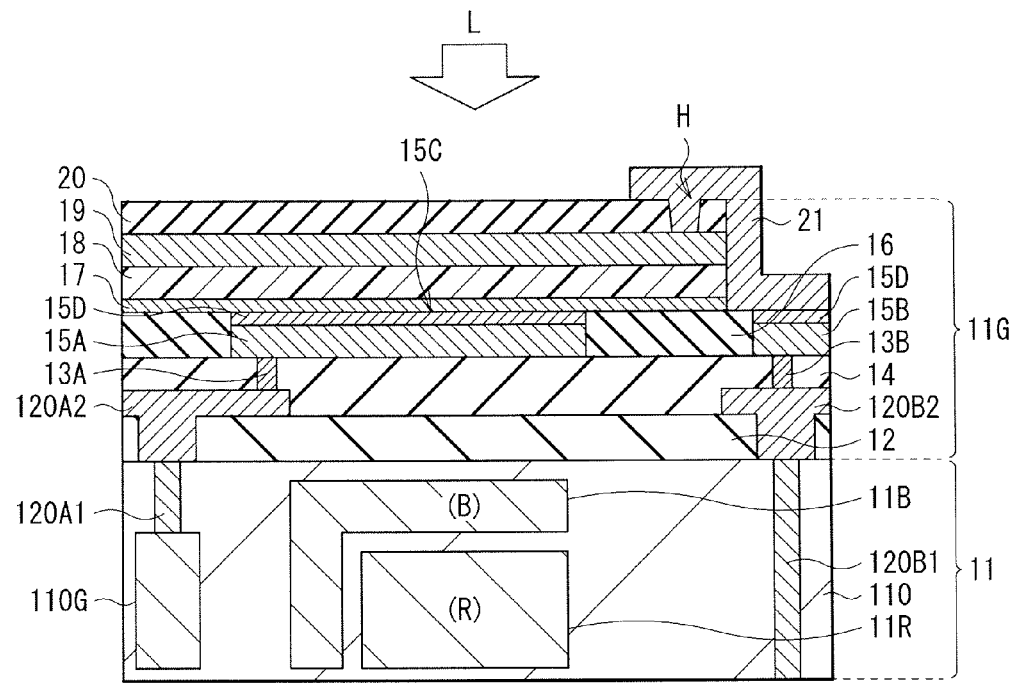
FIG. 26 is a main-part sectional view describing a function of the photoelectric conversion device illustrated in FIG. 1.

In this solid-state image pickup unit 1, for example, as illustrated in FIG. 26, when light L enters the photoelectric conversion device 10 through the on-chip lens 24 (not illustrated in FIG. 26), the light L passes through the organic photoelectric conversion section 11G, the inorganic photoelectric conversion sections 11B and 11R in this order, and green light, blue, light, and red light of the light L are photoelectrically converted in the course of passing.

Figure 27:
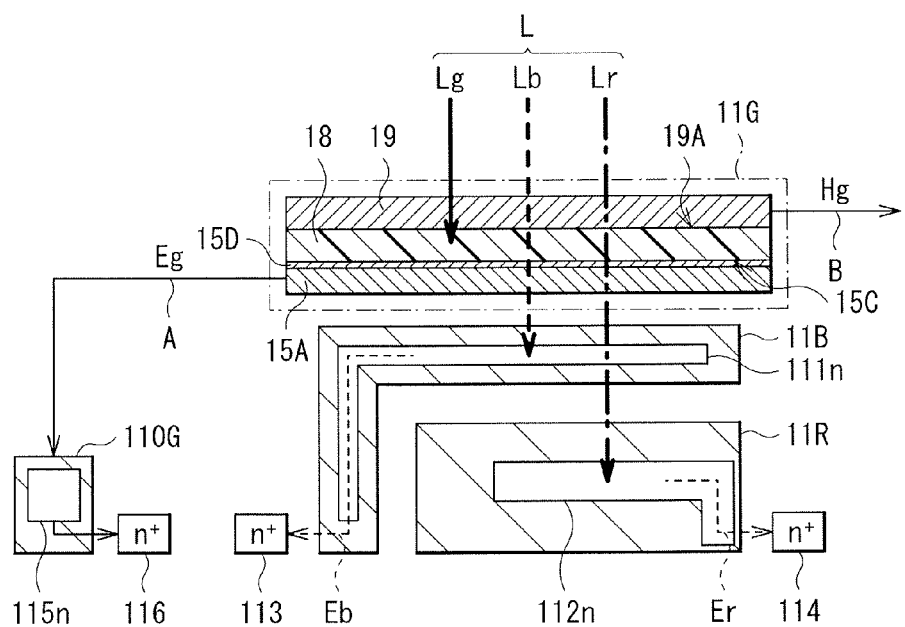
FIG. 27 is a schematic view for describing a function of the photoelectric conversion device illustrated in FIG. 1.

FIG. 27 schematically illustrates a flow of obtaining signal charges (electrons), based on incident light. A specific operation of obtaining a signal in each photoelectric conversion section will be described below.

(Obtaining of Green Signal by Organic Photoelectric Conversion Section 11G)

First, green light Lg of the light L incident on the photoelectric conversion device 10 is selectively detected (absorbed) by the organic photoelectric conversion section 11G to be photoelectrically converted. After electrons Eg of electron-hole pairs thereby generated are drawn from the lower electrode 15A, the electrons Eg are stored in the green storage layer 110G through a transmission path A (the wiring layer 13A and the conductive plugs 120A1 and 120A2). The stored electrons Eg are transferred to the FD 116 in a reading operation. It is to be noted that holes Hg are emitted from the upper electrode 19 side through a transmission path B (the contact metal layer 20, the wiring layers 13B and 15B, and the conductive plugs 120B1 and 120B2).

More specifically, the signal charges are stored as follows. In other words, in this embodiment, a predetermined negative potential VL (<0 V) and a potential VU (<VL) lower than the potential VL are applied to the lower electrode 15A and the upper electrode 19, respectively. It is to be noted that the potential VL is applied to the lower electrode 15A from, for example, the wiring line 51A in the multilayer wiring layer 51 through the transmission path A. The potential VL is applied to the upper electrode 18 from, for example, the wiring line 51A in the multilayer wiring layer 51 through the transmission path B. Therefore, in a charge storing state (an OFF state of the reset transistor that is not illustrated and the transfer transistor Tr1), electrons of the electron-hole pairs generated in the organic photoelectric conversion layer 18 are guided to the lower electrode 15A side with a relatively high potential (holes are guided to the upper electrode 19). Thus, the electrons Eg are drawn from the lower electrode 15A to be stored in the green storage layer 110G (more specifically, the n-type region 115n) through the transmission path A. Moreover, by storage of the electrons Eg, the potential VL of the lower electrode 15A brought into conduction with the green storage layer 110G is changed. A change amount of the potential VL corresponds to a signal potential (a potential of a green signal in this case).

In this case, the lower electrode 15A and the upper electrode 19 are made of the same transparent conductive material, and the oxygen amount at the interface 15C on the organic photoelectric conversion layer 18 side of the lower electrode 15A (i.e., the oxygen amount of the reduced layer 15D) is smaller than the oxygen amount at the interface 19A on the organic photoelectric conversion layer 18 side of the upper electrode 19. Therefore, the work function at the interface 15C of the lower electrode 15A is reduced, thereby easily drawing electrons and improving sensitivity.

On the other hand, in related art, to adjust the work function at the interface of the lower electrode, the lower electrode has a laminate configuration of an ITO transparent electrode and a metal thin film. Since the transmittance of the metal film is extremely low, even if the electrode is configured of an extremely thin film, light transmittance of the electrode is reduced by inserting a metal film.

In this embodiment, the work function at the interface 15C of the lower electrode 15A is adjusted by the oxygen amount at the interface 15C on the organic photoelectric conversion layer 18 side of the lower electrode 15A (i.e., the oxygen amount of the reduced layer 15D). Therefore, unlike the related art, the metal film is not inserted, and reduction in light transmittance of the lower electrode 15A is prevented.

In the reading operation, the transfer transistor Tr1 is turned to an ON state, and the electrons Eg stored in the green storage layer 110G are transferred to the FD 116. Accordingly, a green signal based on a light reception amount of the green light Lg is read to the vertical signal line Lsig through, for example, another pixel transistor that is not illustrated. After that, the reset transistor that is not illustrated and the transfer transistor Tr1 are turned to an ON state, and the FD 116 as the n-type region and a storage region (the n-type region 115n) of the green storage layer 110G are reset to, for example, a power supply voltage VDD.

(Obtaining of Blue Signal and Red Signal by Inorganic Photoelectric Conversion Sections 11B and R)

Next, blue light and red light of light having passed through the organic photoelectric conversion section 11G are absorbed in order by the inorganic photoelectric conversion section 11B and the inorganic photoelectric conversion section 11R, respectively, to be photoelectrically converted. In the inorganic photoelectric conversion section 11B, electrons Eb corresponding to incident blue light are stored in the n-type region (the n-type photoelectric conversion layer 111n), and the stored electrons Eb are transferred to the FD 113 in the reading operation. It is to be noted that holes are stored in a p-type region that is not illustrated. Likewise, in the inorganic photoelectric conversion section 11R, electrons Er corresponding to incident red light are stored in the n-type region (the n-type photoelectric conversion layer 112n), and the stored electrons Er are transferred to the FD 114 in the reading operation. It is to be noted that holes are stored in a p-type region that is not illustrated.

In the charge storing state, as described above, since the negative potential VL is applied to the lower electrode 15A of the organic photoelectric conversion section 11G, a hole concentration in the p-type region (the p-type region 111p in FIG. 4) as a hole storage layer of the inorganic photoelectric conversion section 11B tends to increase. Therefore, the generation of a dark current at an interface between the p-type region 111p and the interlayer insulating layer 12 is allowed to be reduced.

In the reading operation, as with the above-described organic photoelectric conversion section 11G, the transfer transistors Tr2 and Tr3 are turned to an ON state, and the electrons Eb and Er stored in the n-type photoelectric conversion layers 111n and 112n are transferred to the FDs 113 and 114, respectively. Accordingly, a blue signal based on a light reception amount of the blue light Lb and a red signal based on a light reception amount of the red light Lr are read to the vertical signal line Lsig through other pixel transistors that are not illustrated. After that, the reset transistor that is not illustrated and the transfer transistors Tr2 and 3 are turned to the ON state, and the FDs 113 and 114 as the n-type regions are reset to, for example, the power supply voltage VDD.

As described above, when the organic photoelectric conversion section 11G and the inorganic photoelectric conversion sections 11B and 11R are laminated along the vertical direction, red light, green light, and blue light are allowed to be separately detected without providing a color filter to obtain signal charges of respective colors. Therefore, light loss (reduction in sensitivity) due to color light absorption by the color filter or generation of a false color associated with pixel interpolation processing is allowed to be reduced.

Thus, in the photoelectric conversion device 10 of this embodiment, the lower electrode 15A and the upper electrode 19 are made of the same transparent conductive material. The oxygen amount at the interface 15C on the organic photoelectric conversion layer 18 side of the lower electrode 15A is allowed to be smaller than the oxygen amount at the interface 19A on the organic photoelectric conversion layer 18 side of the upper electrode 19. Therefore, the work function is allowed to be adjusted without reducing light transmittance of the electrodes.

In the method of manufacturing the photoelectric conversion device 10 of this embodiment, the inorganic oxide layer 17 with a higher metal content ratio than that in the ideal composition is formed on the lower electrode 15A. The reduced layer 15D is formed in a part in the thickness direction from the interface 15C on the organic photoelectric conversion layer 18 side of the lower electrode 15A by annealing treatment, and the oxygen amount of the reduced layer 15D is allowed to be smaller than the oxygen amount of the transparent conductive material forming the lower electrode 15A. Therefore, the reduced layer 15D is allowed to be formed without reducing the transmittance of the lower electrode 15A, and the work function of the lower electrode 15A is allowed to be adjusted.

Modification Example 1

Figure 28:
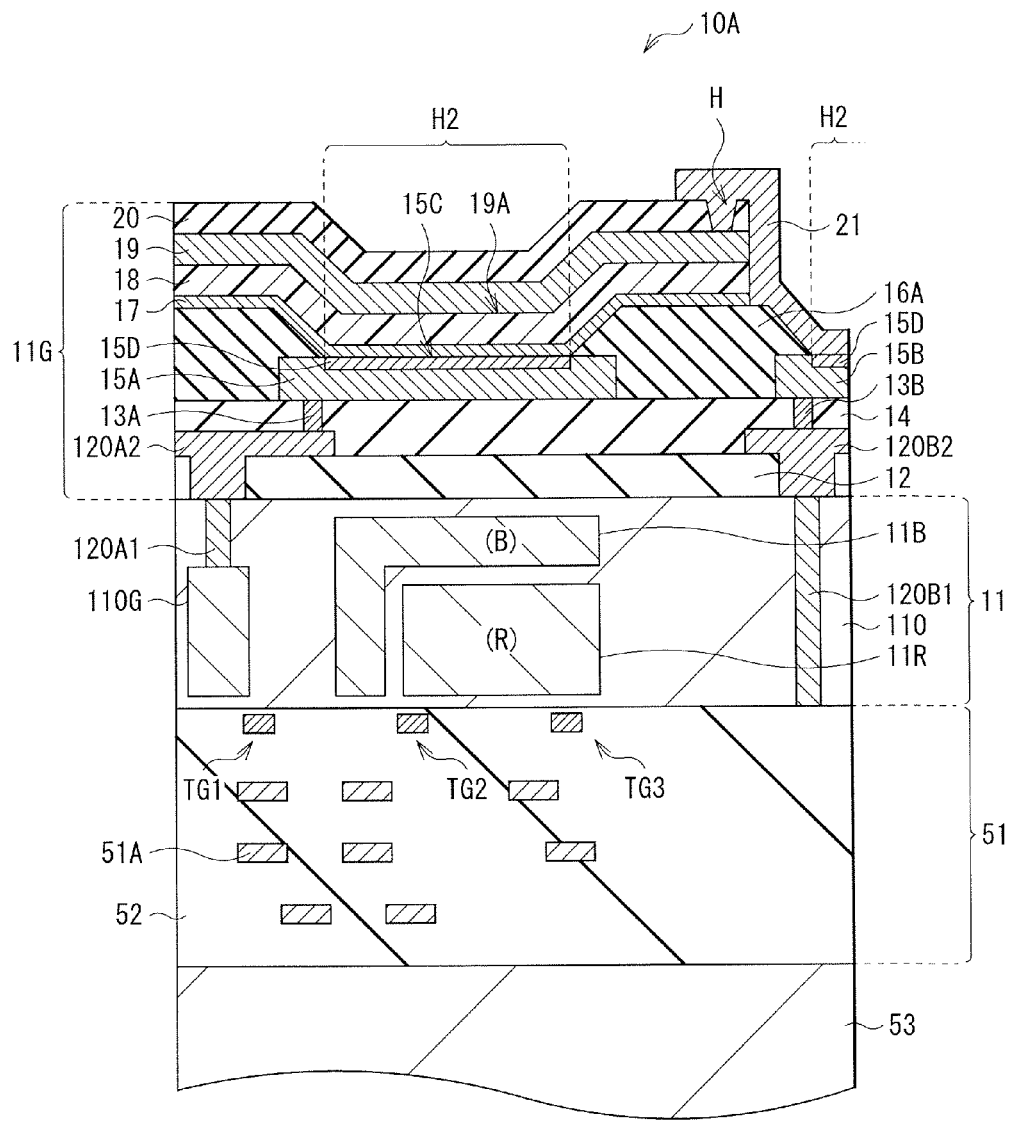
FIG. 28 is a sectional view illustrating a configuration of a photoelectric conversion device according to Modification Example 1.

It is to be noted that in the above-described embodiment, a configuration in which the insulating film 16 is planarized and a difference in level between the insulating film 16 and the lower electrode 15 is reduced is exemplified; however, an insulating film 16A as illustrated in FIG. 28 may be used. In a photoelectric conversion device 10A of this modification example, the insulating film 16A includes openings H2 on the lower electrode 15A and on the wiring layer 15B to have a difference in level between the lower electrode 15A and the wiring layer 15B. However, side surfaces of the openings H2 have a slightly tapered shape, and the inorganic oxide layer 17 and the organic photoelectric conversion layer 18 are continuously provided on a top surface and a side surface of the insulating film 16A and in the opening H2 without being separated by the difference in level. The reduced layer 15D is provided to a region where the lower electrode 15A or the wiring layer 15B and the inorganic oxide layer 17 are in contact with each other in the opening H2.

For example, this photoelectric conversion device 10A may be manufactured as follows.

FIGS. 29 to 32 illustrate a main part (a method of forming the insulating film 16A) of the method of manufacturing this photoelectric conversion device 10A in process order. It is to be noted that same processes as those in the above-described embodiment will not be described.

Figure 29:
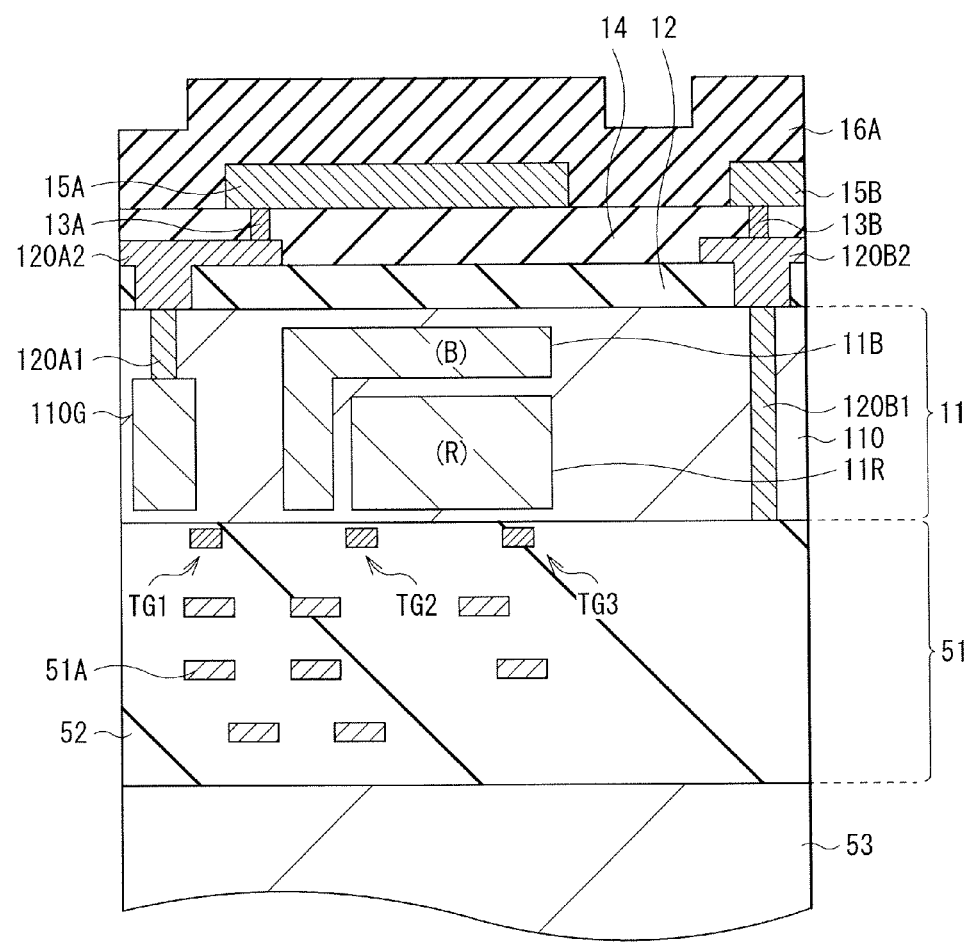
FIG. 29 is a sectional view illustrating a method of manufacturing the photoelectric conversion device illustrated in FIG. 28 in process order.
Figure 30:
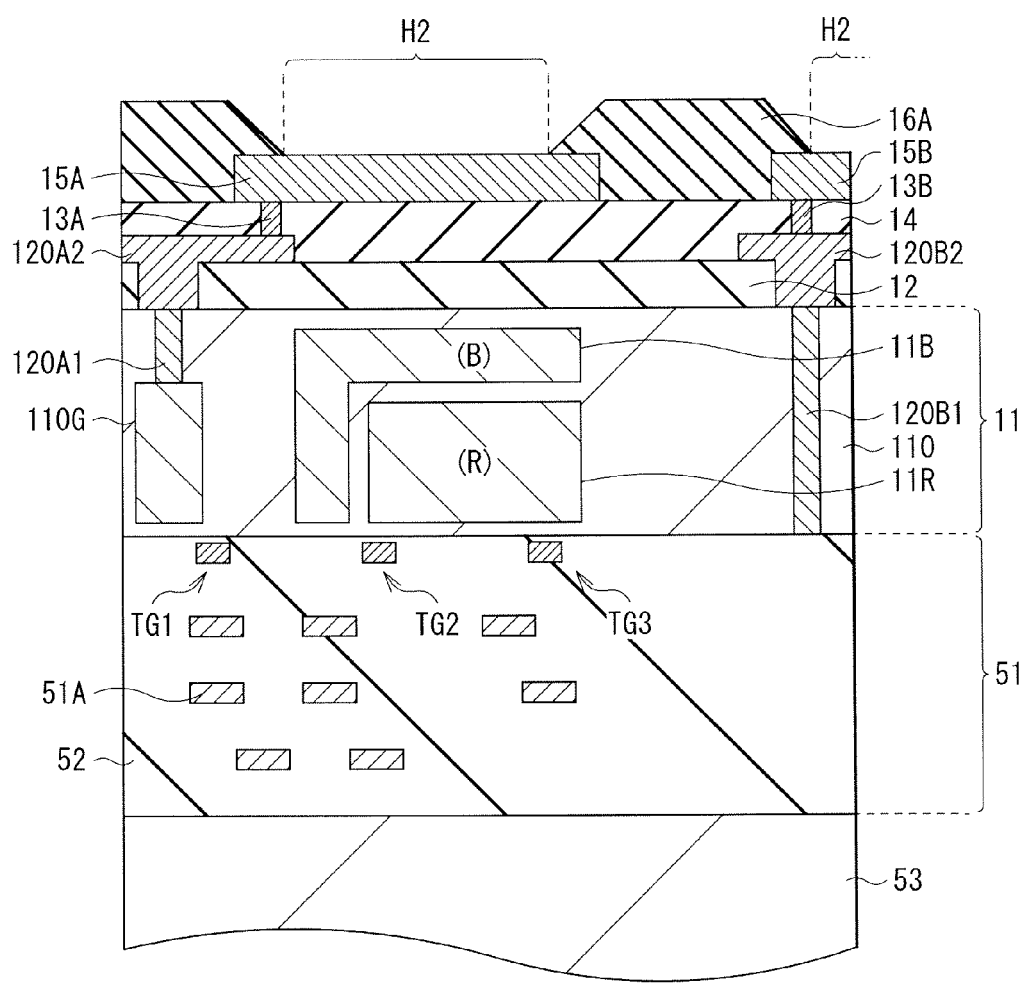
FIG. 30 is a sectional view illustrating a process following FIG. 29.
Figure 31:
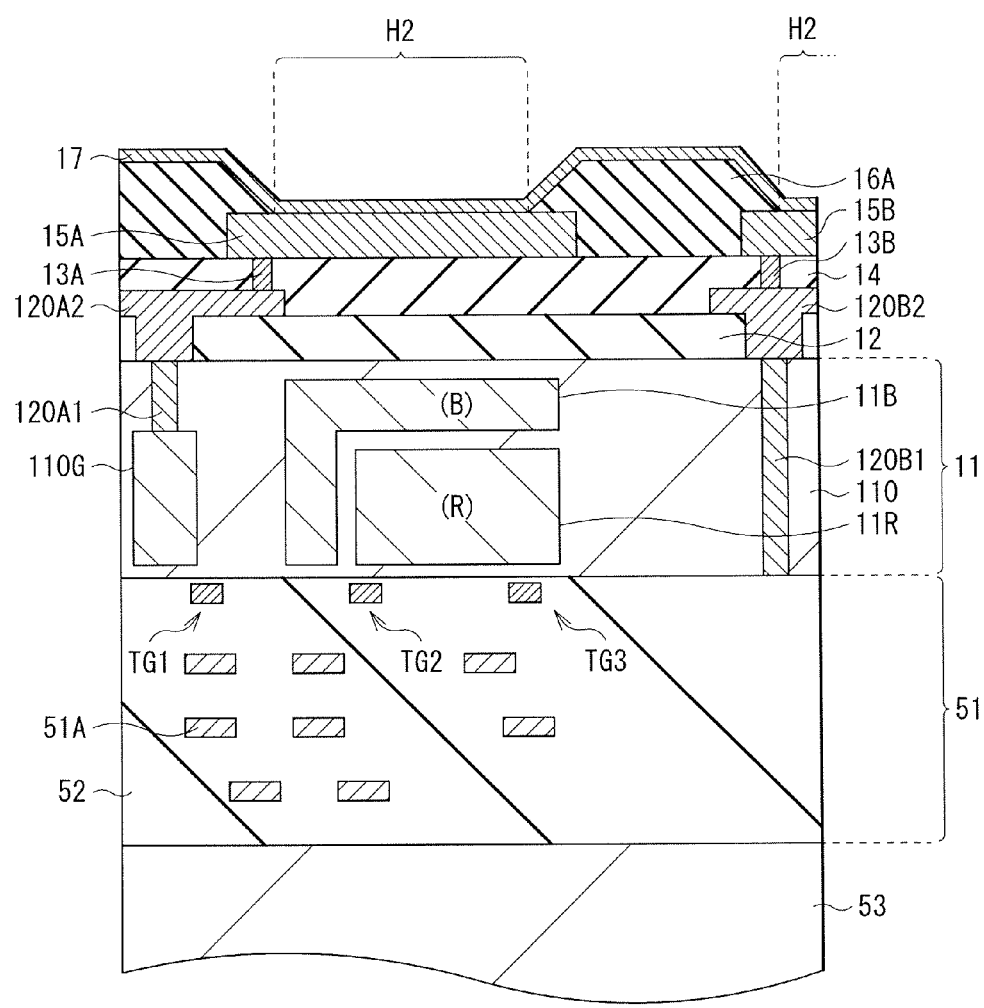
FIG. 31 is a sectional view illustrating a process following FIG. 30.
Figure 32:
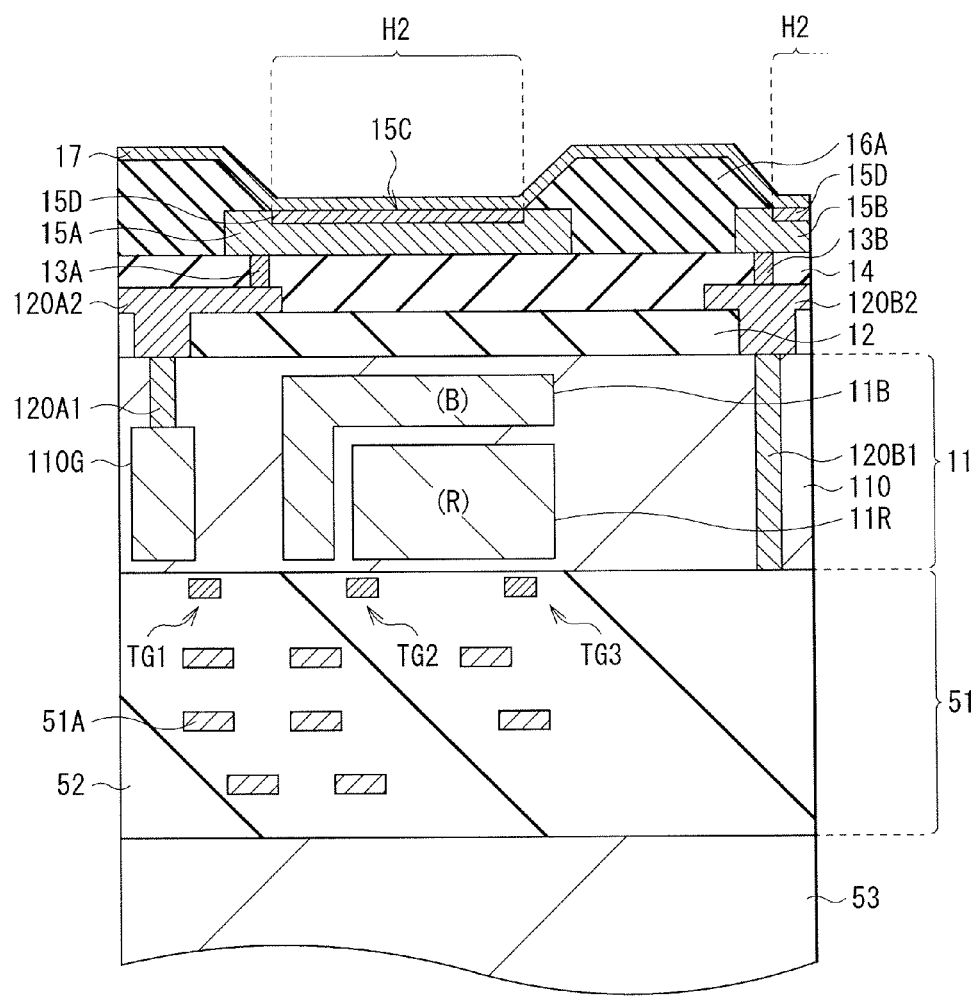
FIG. 32 is a sectional view illustrating a process following FIG. 31.

For example, as illustrated in FIG. 29, the insulating film 16A is formed on the entire surface of the semiconductor substrate 11 to cover the lower electrode 15A and the wiring layer 15B. Next, as illustrated in FIG. 30, the openings H2 are formed by etching with use of a photolithography method. As the insulating film 16A, in addition to the above-described material, a photosensitive resin or the like may be used, and in this case, a rounded shape without edges is allowed to be formed by performing reflow after forming the openings H2. Next, as illustrated in FIG. 31, as with the above-described embodiment, the inorganic oxide layer 17 is formed. After that, as illustrated in FIG. 32, as with the above-described embodiment, the reduced layer 15D with a smaller oxygen amount than that of the lower electrode 15A is formed in a part in the thickness direction from the interface 15C of the lower electrode 15A or the wiring layer 15B by annealing treatment. The reduced layer 15D is formed in a region where the lower electrode 15A or the wiring layer 15B and the inorganic oxide layer 17 are in contact with each other in the opening H2.

Second Embodiment

Figure 33:
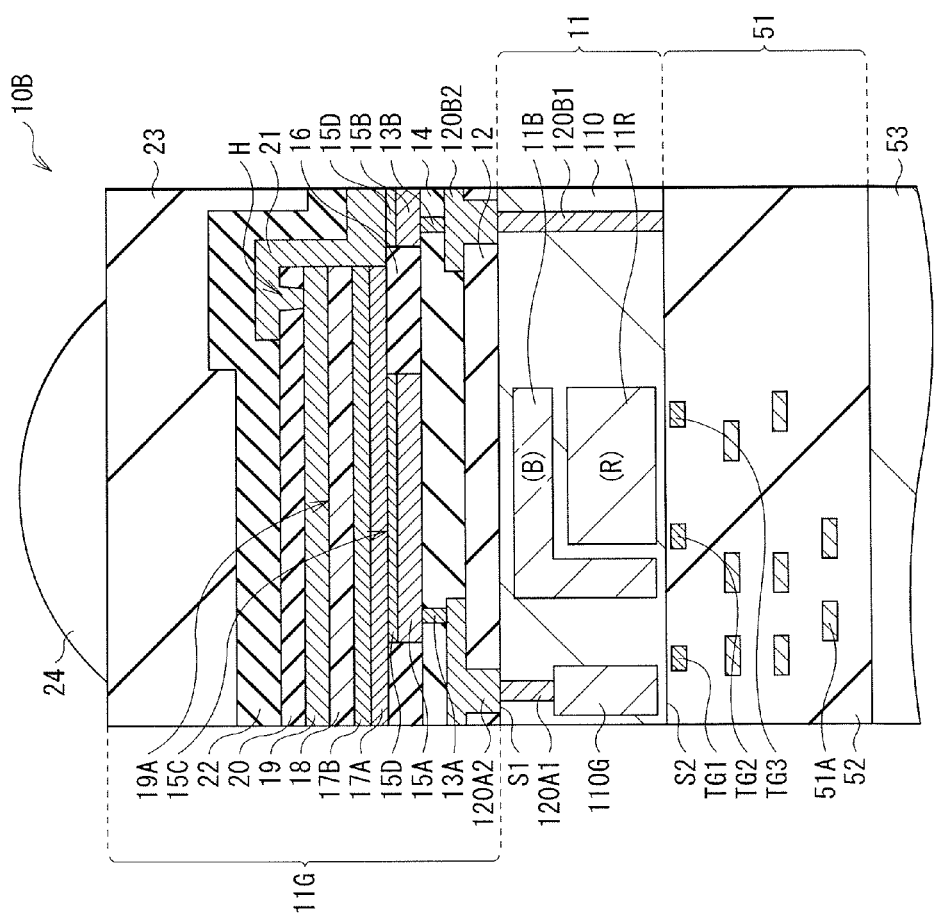
FIG. 33 is a sectional view illustrating a schematic configuration of a photoelectric conversion device according to a second embodiment of the present disclosure.

FIG. 33 illustrates a sectional configuration of a semiconductor device (a photoelectric conversion device) according to a second embodiment of the present disclosure. The photoelectric conversion device 10B includes a first inorganic oxide layer 17A and a second inorganic oxide layer 17B between the reduced layer 15D and the organic photoelectric conversion layer 18. Except for this, the photoelectric conversion device 10B of this embodiment has a configuration, functions, and effects similar to those in the above-described first embodiment. Therefore, description will be given with like reference numerals indicating like components corresponding to the first embodiment.

The inorganic oxide layer 17 in the above-described first embodiment has both a function as a hole block layer and a function as a work function adjustment layer that accelerates reduction of the lower electrode 15A in a manufacturing process to adjust the work function at the interface 15C of the lower electrode 15A. On the other hand, in this embodiment, the inorganic oxide layer has a two-layer configuration, and the first inorganic oxide layer 17A on the reduced layer 15D side has functions as, preliminarily, a work function adjustment layer and, secondarily, a hole block layer. On the other hand, the second inorganic oxide layer 17B on the organic photoelectric conversion layer 18 side has functions as, preliminarily, a hole block layer and, secondarily, a work function adjustment layer. Therefore, each of the first inorganic oxide layer 17A and the second inorganic oxide layer 17B is made of an optimum material according to each main function, and is allowed to enhance its performance accordingly.

The first inorganic oxide layer 17A may have, for example, a thickness of 30 nm or less, and is made of one or more kinds of a group configured of tantalum oxide, molybdenum oxide, vanadium oxide, tungsten oxide, hafnium oxide, and cesium oxide.

The second inorganic oxide layer 17B may have, for example, a thickness of 30 nm or less, and is made of one or more kinds of a group configured of tantalum oxide, molybdenum oxide, vanadium oxide, tungsten oxide, hafnium oxide, and cesium oxide.

The first inorganic oxide layer 17A and the second inorganic oxide layer 17B may be made of a same metal oxide (with different compositions) or may be made of different metal oxides. In the latter case, the first inorganic oxide layer 17A may preferably emphasize the function as the work function adjustment layer, and may be preferably made of an inorganic oxide of which a metal content ratio is easily adjusted to be higher than that in an ideal composition of the above-described metal oxides. On the other hand, the second inorganic oxide layer 17B may preferably emphasize the function as the hole block layer and may be preferably made of an inorganic oxide with high hole block performance of the above-described metal oxides.

There is the following advantage caused by the two-layer configuration of the first inorganic oxide layer 17A and the second inorganic oxide layer 17B. Namely, since the first inorganic oxide layer 17A accelerates reduction of the lower electrode 15A, the first inorganic oxide layer 17A may desirably have a higher metal content ratio than that in the ideal composition, but on the other hand, insulation properties may be reduced to cause dark current degradation or the like. The second inorganic oxide layer 17B is allowed to be made of an inorganic oxide with a composition close to the ideal composition, and is allowed to reduce the dark current.

For example, this photoelectric conversion device 10B may be manufactured as follows.

FIGS. 34 to 37 illustrate a main part of a method of manufacturing the photoelectric conversion device 10B in process order. It is to be noted that same processes as those in the above-described first embodiment will not be described.

Figure 34:
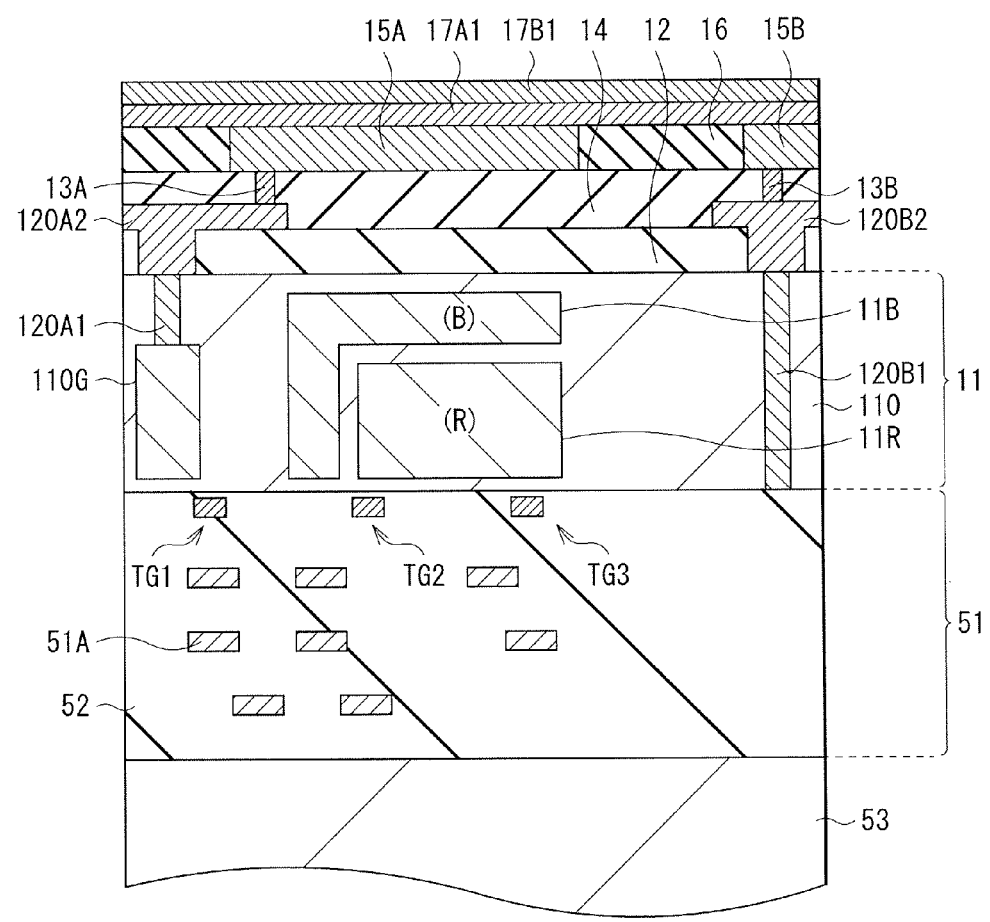
FIG. 34 is a sectional view illustrating a method of manufacturing the photoelectric conversion device illustrated in FIG. 33 in process order.

First, as illustrated in FIG. 34, a first layer 17A1 made of an inorganic oxide with a higher metal content ratio than that in the ideal composition or a metal is formed as a work function adjustment layer on the lower electrode 15A, the wiring layer 15B, and the insulating film 16. More specifically, as the first layer 17A1, for example, a film made of tantalum oxide that is tantalum-richer (TaxOy, x/y>0.4) than a $Ta_2O_5$ composition (ideal composition) or a tantalum metal is formed by, for example, a sputtering method.

Next, also as illustrated in FIG. 34, a second layer 17B1 having a larger oxygen amount (being oxygen-richer) than the first layer 17A1 is formed on the first layer 17A1. The second layer 17B1 is allowed to be made of an inorganic oxide having a composition closer to the ideal composition than the first layer 17A1, for example, tantalum oxide having the $Ta_2O_5$ composition (ideal composition).

Figure 35:
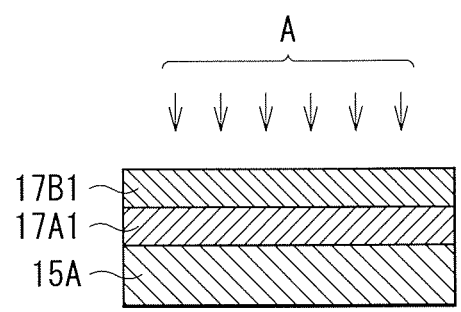
FIG. 35 is a sectional view illustrating a process following FIG. 34.
Figure 36:
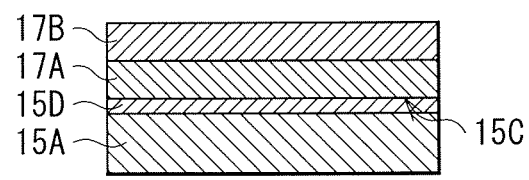
FIG. 36 is a sectional view illustrating a process following FIG. 35.
Figure 37:
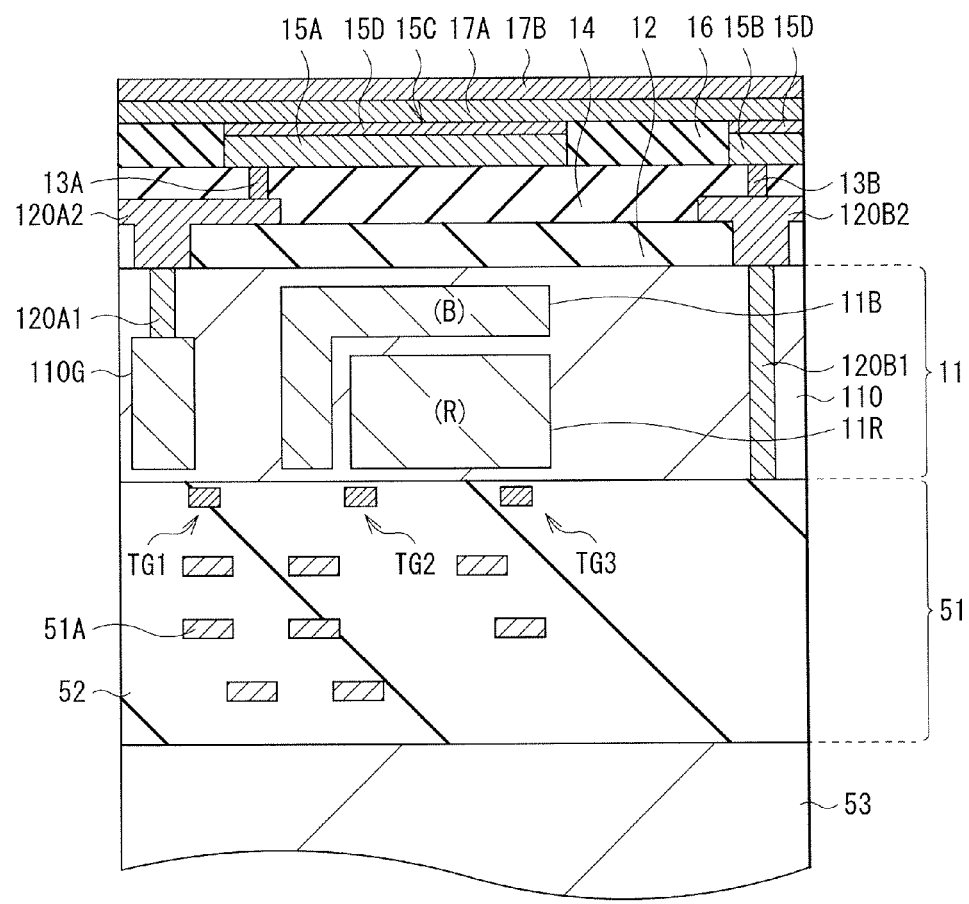
FIG. 37 is a sectional view illustrating a process following FIG. 36.

After the inorganic oxide layer 17 is formed, as illustrated in FIG. 35, the annealing treatment A at, for example, 200° C. to 450° C. is performed. Accordingly, the first layer 17A1 made of the metal-rich inorganic oxide or the metal reduces the lower electrode 15A, and as illustrated in FIG. 36, the reduced layer 15D is formed in a part in the thickness direction from the interface 15C of the lower electrode 15A. The oxygen amount in the reduced layer 15D is allowed to be smaller than the oxygen amount of the transparent conductive material forming the lower electrode 15A. Accordingly, the first layer 17A1 becomes the first inorganic oxide layer 17A, and the second layer 17B1 becomes the second inorganic oxide layer 17B. In a case where the first layer 17A1 is a metal film, the metal is oxidized to form the first inorganic oxide layer 17A. It is to be noted that, as illustrated in FIG. 37, the reduced layer 15D is also formed in a part in the thickness direction from the interface 15C of the wiring layer 15B in a similar manner.

In this photoelectric conversion device 10B, as with the first embodiment, signal charges (electrons), based on incident light are obtained. In this case, the first inorganic oxide layer 17A and the second inorganic oxide layer 17B are provided between the reduced layer 15D and the organic photoelectric conversion layer 18. Therefore, even in a case where the first inorganic oxide layer 17A is made of the inorganic oxide with a higher metal content ratio than that in the ideal composition, and the insulation properties of the first inorganic oxide layer 17A are reduced, a dark current is reduced by the second inorganic oxide layer 17B made of the inorganic oxide with a composition close to the ideal composition.

Thus, in the photoelectric conversion device 10B of this embodiment, the first inorganic oxide layer 17A and the second inorganic oxide layer 17B are provided between the reduced layer 15D and the organic photoelectric conversion layer 18; therefore, each of the first inorganic oxide layer 17A and the second inorganic oxide layer 17B is allowed to be made of an optimum material according to each function. Therefore, while the first inorganic oxide layer 17A is made of the inorganic oxide with a higher metal content ratio than that in the ideal composition to accelerate reduction of the lower electrode 15A, the second inorganic oxide layer 17B is allowed to be made of the inorganic oxide with a composition close to the ideal composition to reduce the dark current.

In the method of manufacturing the photoelectric conversion device 10B of this embodiment, the first layer 17A1 made of the inorganic oxide with a higher metal content ratio than that in the ideal composition or the metal and the second layer 17B1 made of the inorganic oxide having a larger oxygen amount than the first layer 17A1 are formed in order on the lower electrode 15A. While the reduced layer 15D is formed in a part in the thickness direction from the interface 15C on the organic photoelectric conversion layer 18 side of the lower electrode 15A by annealing treatment, the oxygen amount of the reduced layer 15D is allowed to be smaller than the oxygen amount of the transparent conductive material forming the lower electrode 15A. Thus, the reduced layer 15D is formed without reducing transmittance of the lower electrode 15A, and the work function of the lower electrode 15A is allowed to be adjusted.

Modification Example 2

FIGS. 38 to 43 illustrate a main part of a method of manufacturing a photoelectric conversion device 10B according to Modification Example 2 in process order. In this manufacturing method, annealing treatment to form the reduced layer 15D is performed before forming the insulating film 16. It is to be noted that same processes as those in the above-described first embodiment will not be described.

Figure 38:
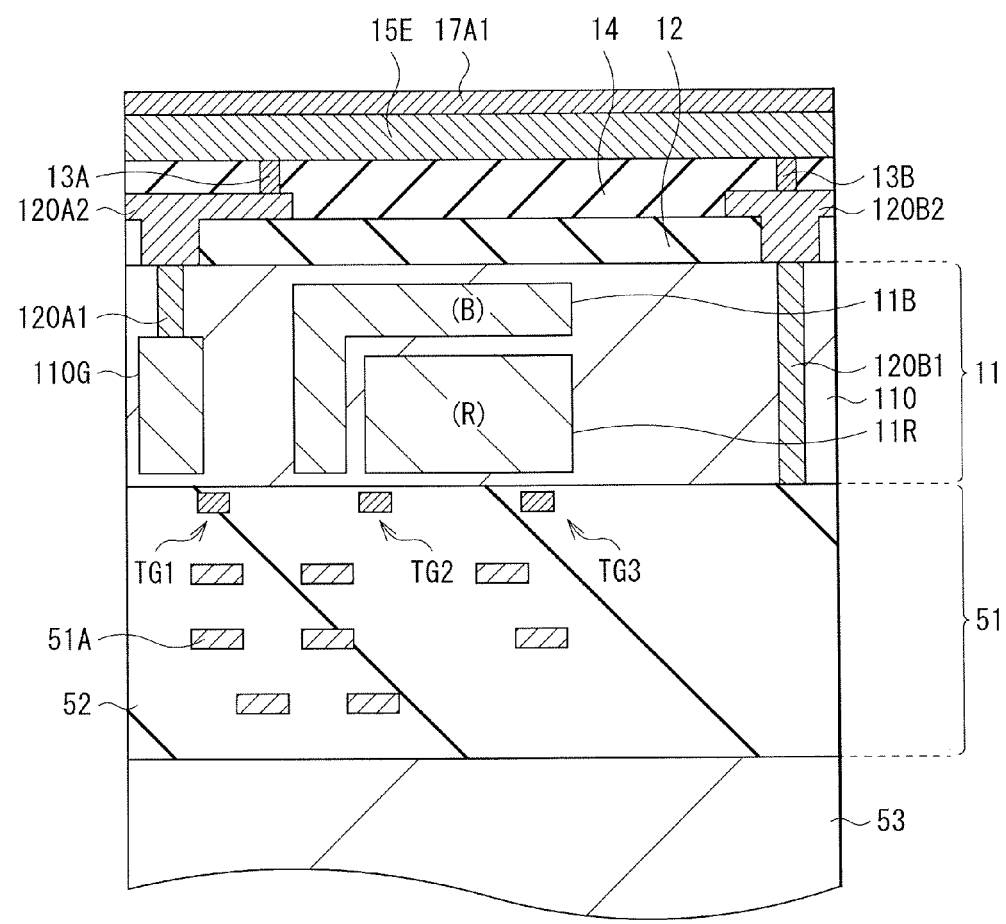
FIG. 38 is a sectional view illustrating a method of manufacturing a photoelectric conversion device according to Modification Example 2 in process order.

First, as illustrated in FIG. 38, a transparent conductive film 15E that forms the lower electrode 15A and the wiring layer 15B is formed on the entire surface of the interlayer insulating film 14 by, for example, a sputtering method.

Next, also as illustrated in FIG. 38, the first layer 17A1 made of an inorganic oxide with a higher metal content ratio than that in the ideal composition or a metal is formed as a work function adjustment layer on the transparent conductive film 15E. More specifically, as the first layer 17A1, a film made of tantalum oxide that is tantalum-richer (TaxOy, x/y>0.4) than the $Ta_2O_5$ composition (ideal composition) or a tantalum metal is formed by, for example, a sputtering method.

Figure 39:
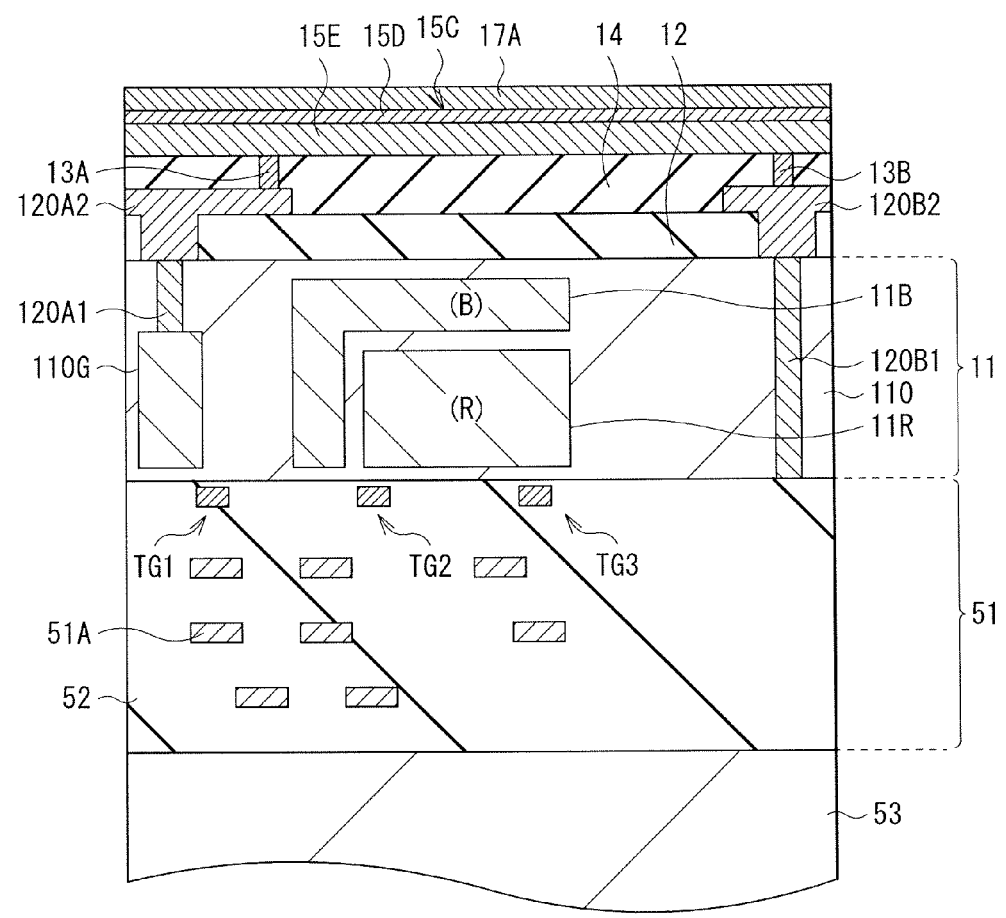
FIG. 39 is a sectional view illustrating a process following FIG. 38.

Next, the annealing treatment A at, for example, 200° C. to 450° C. is performed. Accordingly, the first layer 17A1 made of the metal-rich inorganic oxide or the metal reduces the transparent conductive film 15E, and as illustrated in FIG. 39, the reduced layer 15D is formed in a part in the thickness direction from the interface 15C of the transparent conductive film 15E. The oxygen amount of the reduced layer 15D is allowed to be smaller than the oxygen amount of the transparent conductive material forming the transparent conductive film 15E. Accordingly, the first layer 17A1 becomes the first inorganic oxide layer 17A. In a case where the first layer 17A1 is a metal film, the metal is oxidized to form the first inorganic oxide layer 17A.

Figure 40:
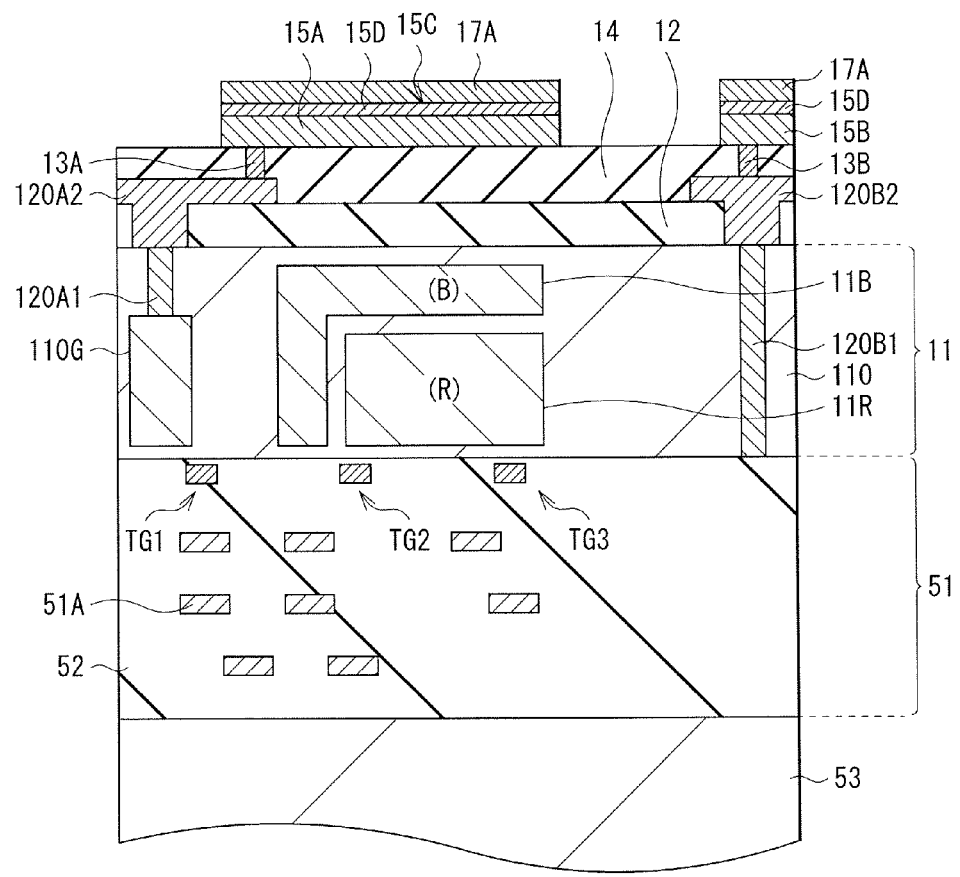
FIG. 40 is a sectional view illustrating a process following FIG. 39.

After that, as illustrated in FIG. 40, patterning is performed with use of a photolithography method, and the first inorganic oxide layer 17A and the transparent conductive film 15E are processed with use of, for example, dry etching or wet etching. At this time, the lower electrode 15A is formed in a region facing the wiring layer 13A. Moreover in processing of the transparent conductive film, the wiring layer 15B configuring a part of a hole transmission path is formed together with the lower electrode 15A by allowing the transparent conductive film 15E to remain also in a region facing the wiring layer 13B.

Figure 41:
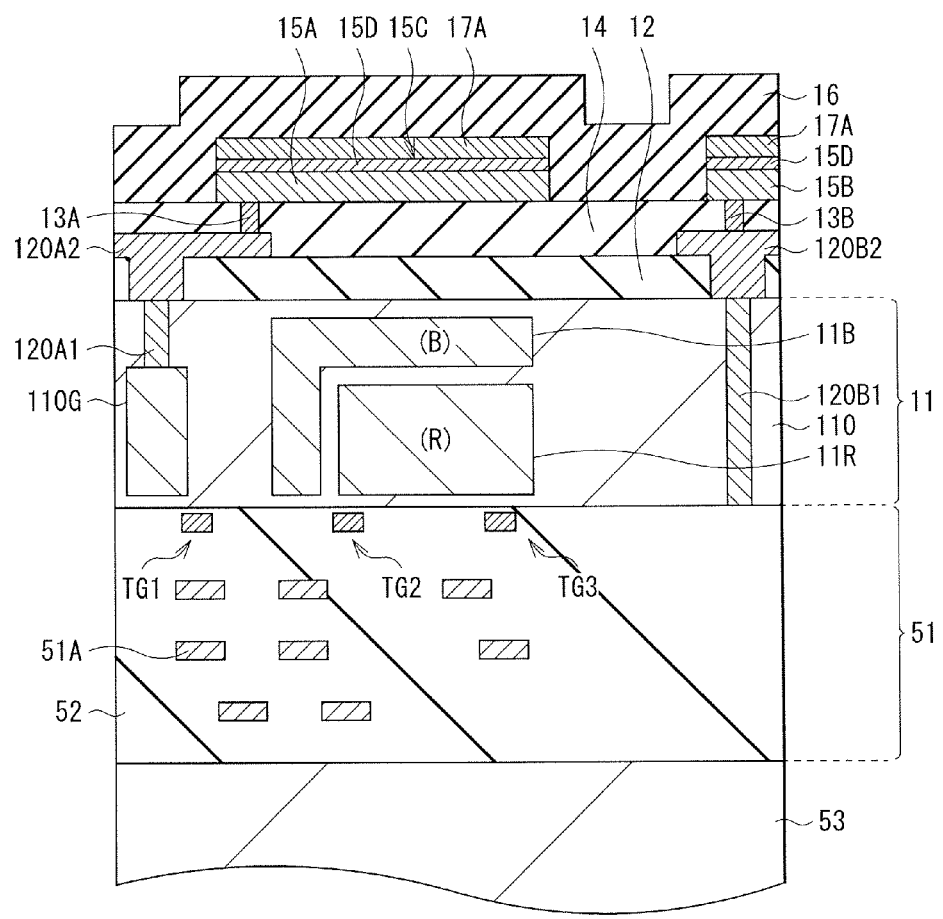
FIG. 41 is a sectional view illustrating a process following FIG. 40.
Figure 42:
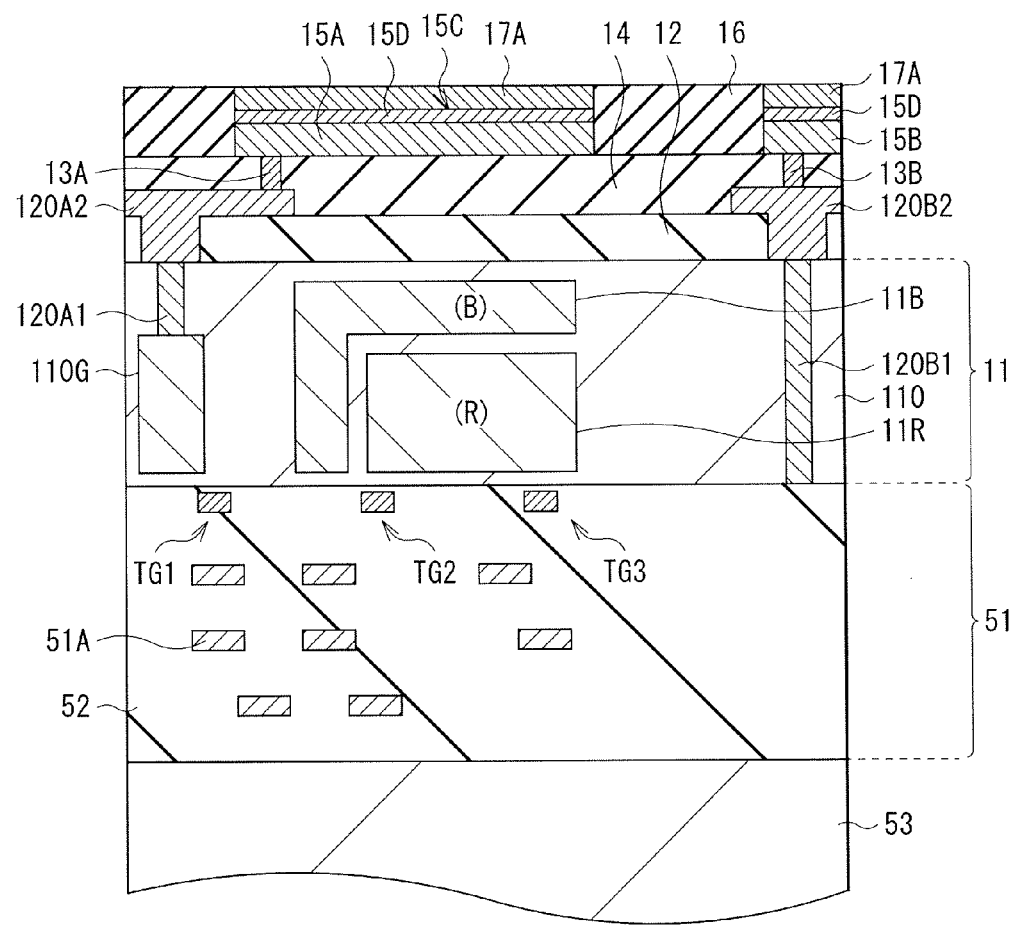
FIG. 42 is a sectional view illustrating a process following FIG. 41.

After the lower electrode 15A and the wiring layer 15B are formed, the insulating film 16 is formed. At this time, first, as illustrated in FIG. 41, the insulating film 16 made of the above-described material is formed on the entire surface of the semiconductor substrate 11 by, for example, a plasma CVD method to cover the interlayer insulating film 14, the lower electrode 15A, the wiring layer 15B, and the first inorganic oxide layer 17A. Next, as illustrated in FIG. 42, the formed insulating film 16 is polished by, for example, a CMP method to expose the lower electrode 15A and the wiring layer 15B from the insulating film 16.

Figure 43:
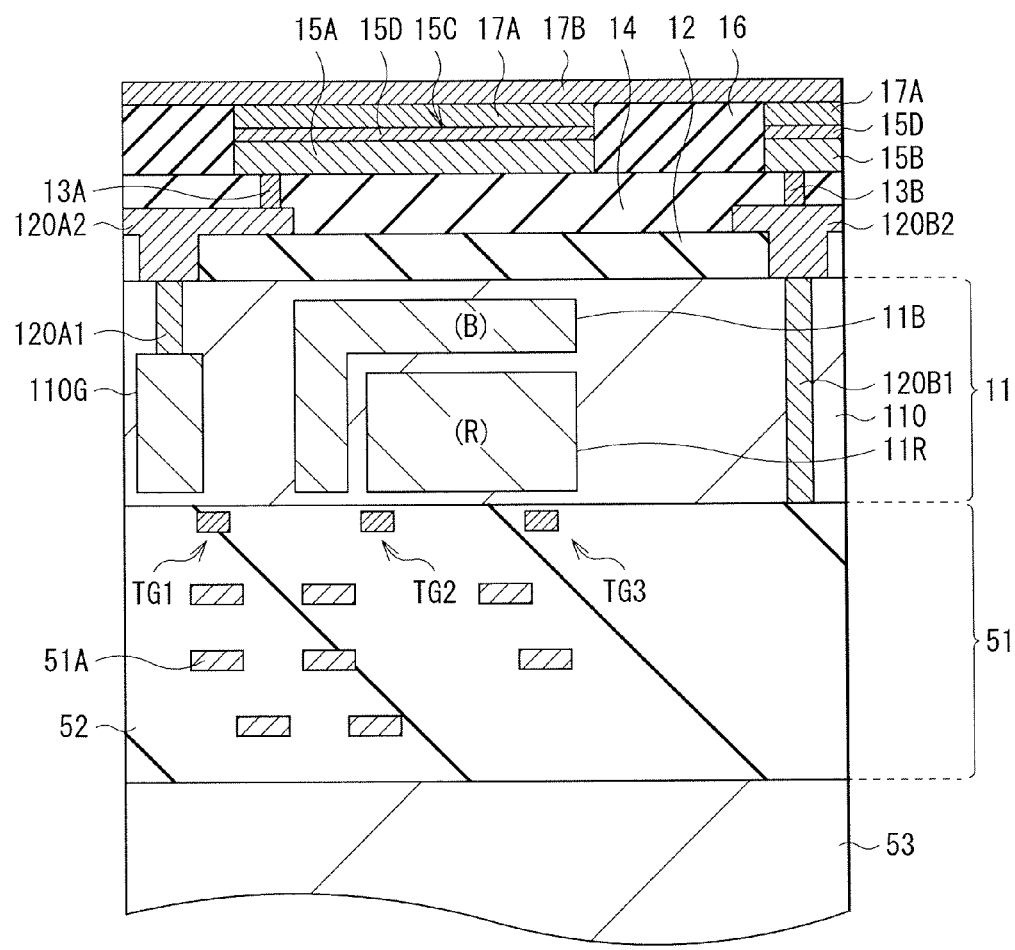
FIG. 43 is a sectional view illustrating a process following FIG. 42.

After the insulating film 16 is formed, as illustrated in FIG. 43, the second inorganic oxide layer 17B made of the above-described material is formed on the first inorganic oxide layer 17A.

It is to be noted that as with the above-described second embodiment, the second inorganic oxide layer 17B may be formed as the second layer 17B1 before annealing treatment. However, in this modification example, after the reduced layer 15D is formed, the second layer 17B1 or the second inorganic oxide layer 17B may be damaged in etching and a CMP process to cause deterioration in the function as the hole block layer. Therefore, the second inorganic oxide layer 17B1 may be desirably formed after the CMP processing of the insulating film 16.

Moreover, even in the first embodiment, as with this modification example, annealing treatment to form the reduced layer 15D may be performed before forming the insulating film 16. However, in this case, after the reduced layer 15D is formed, the inorganic oxide layer 17 may be damaged in etching and the CMP process to cause deterioration in the function as the hole block layer. Therefore, after CMP processing of the insulating film 16, another inorganic oxide layer may be preferably additionally formed (corresponding to the second inorganic oxide layer 17B1) to complement the function as the hole block layer.

Third Embodiment

Figure 44:
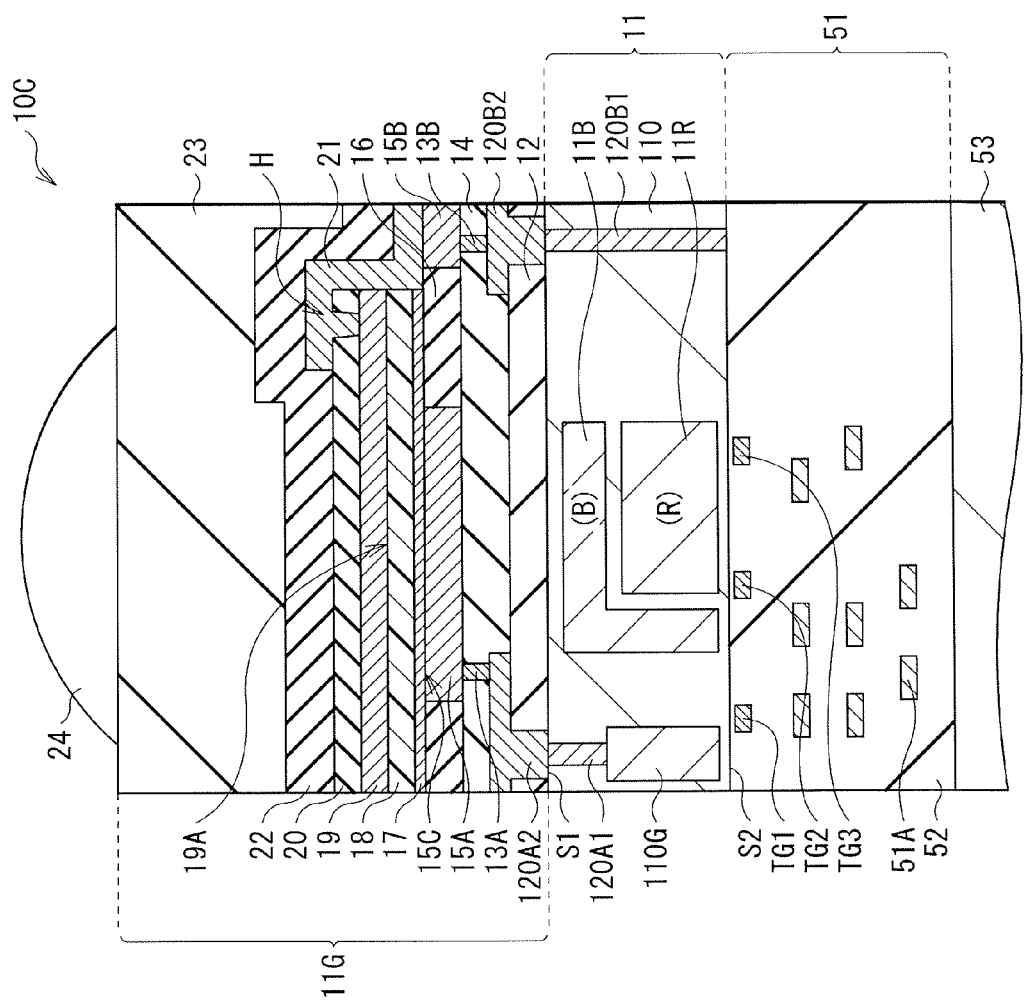
FIG. 44 is a sectional view illustrating a schematic configuration of a photoelectric conversion device according to a third embodiment of the present disclosure.

FIG. 44 illustrates a sectional configuration of a semiconductor device (a photoelectric conversion device) according to a third embodiment of the present disclosure. The photoelectric conversion device 10C is configured to produce a work function difference between the upper electrode 19 and the lower electrode 15A by adjusting the oxygen amount of the upper electrode 19. Except for this, the photoelectric conversion device 10C of this embodiment has a configuration, functions and effects similar to those in the above-described first embodiment. Therefore, description will be given with like reference numerals indicating like components corresponding to the first embodiment.

Figure 45:
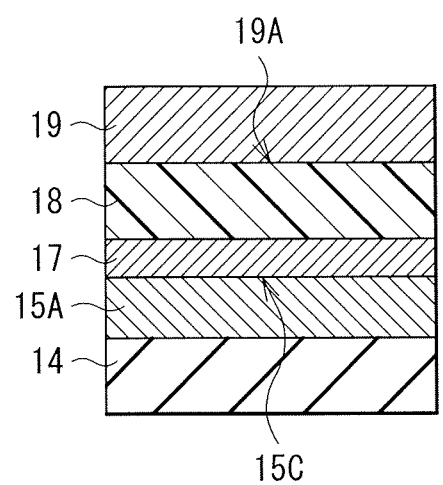
FIG. 45 is a sectional view illustrating a main part of the photoelectric conversion device illustrated in FIG. 44.

FIG. 45 illustrates a main-part configuration of the photoelectric conversion device 10C illustrated in FIG. 44. The upper electrode 19 and the lower electrode 15A are made of a same transparent conductive material, for example, ITO. The oxygen amount at the interface 19A on the organic photoelectric conversion layer 18 side of the upper electrode 19 is larger than the oxygen amount at the interface 15C on the organic photoelectric conversion layer 18 side of the lower electrode 15A. Therefore, in the photoelectric conversion device 10C, as with the first embodiment, the work function is allowed to be adjusted without reducing light transmittance of the electrodes.

For example, this photoelectric conversion device 10C may be manufactured as follows.

Figure 46:
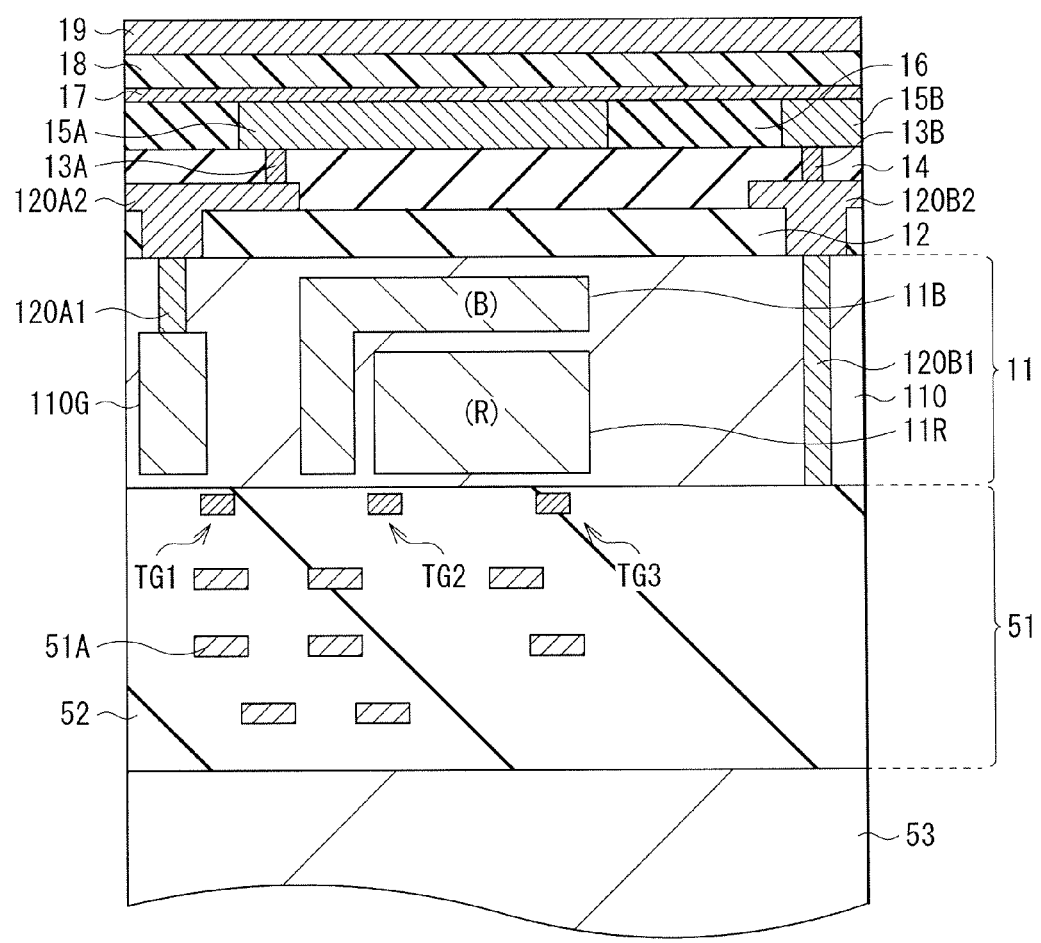
FIG. 46 is a sectional view illustrating a method of manufacturing the photoelectric conversion device illustrated in FIG. 44 in process order.
Figure 47:
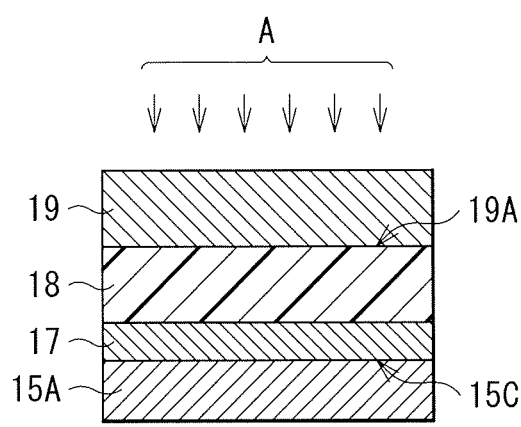
FIG. 47 is a sectional view illustrating a process following FIG. 46.
Figure 48:
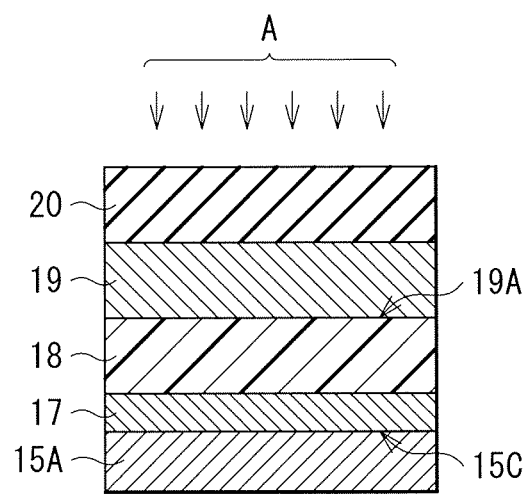
FIG. 48 is a sectional view illustrating a process following FIG. 47.

FIGS. 46 to 48 illustrate a main part of a method of manufacturing the photoelectric conversion device 10C in process order. It is to be noted that same processes as those in the above-described first embodiment will not be described.

First, as illustrated in FIG. 46, as with the first embodiment, the lower electrode 15A, the wiring layer 15B, the insulating film 16, and the inorganic oxide layer 17 are formed on the interlayer insulating film 14 in order. After the inorganic oxide layer 17 is formed, the organic photoelectric conversion layer 18 and the upper electrode 19 are successively formed in order without performing the annealing treatment A.

After the upper electrode 19 is formed, as illustrated in FIG. 47, the annealing treatment A at, for example, 200° C. to 450° C. is performed. Accordingly, a whole in the thickness direction of the upper electrode 19 is oxidized, and the oxygen amount at the interface 19A on the organic photoelectric conversion layer 18 side of the upper electrode 19 is larger than the oxygen amount at the interface 15C on the organic photoelectric conversion layer 18 side of the lower electrode 15A. Therefore, the work function of the upper electrode 19 is allowed to be increased without reducing the transmittance of the upper electrode 19.

After the upper electrode 19 is formed, as illustrated in FIG. 48, the hard mask layer 20 made of the above-described material is formed. At this time, the annealing treatment A of the upper electrode 19 may be preferably performed in a film formation chamber in which the hard mask layer 20 is formed. It is because the annealing treatment A of the upper electrode 19 is allowed to be performed concurrently with a process of forming the hard mask layer 20, and the number of processes is allowed to be reduced.

In this photoelectric conversion device 10C, as with the first embodiment, signal charges (electrons), based on incident light are obtained. In this case, the lower electrode 15A and the upper electrode 19 are made of a same transparent conductive material, and the oxygen amount at the interface 19A on the organic photoelectric conversion layer 18 side of the upper electrode 19 is larger than the oxygen amount at the interface 15C on the organic photoelectric conversion layer 18 side of the lower electrode 15A. Therefore, the work function at the interface 19A of the upper electrode 19 is increased, electrons are drawn from the upper electrode 19 more easily than from the lower electrode 15A, and sensitivity is improved.

As described above, in the photoelectric conversion device 10C of this embodiment, the lower electrode 15A and the upper electrode 19 are made of the same transparent conductive material. The oxygen amount at the interface 19A on the organic photoelectric conversion layer 18 side of the upper electrode 19 is allowed to be larger than the oxygen amount at the interface 15C on the organic photoelectric conversion layer 18 side of the lower electrode 15A. Therefore, the work function is allowed to be adjusted without reducing light transmittance of the upper electrode 19.

In a method of manufacturing the photoelectric conversion device 10C of this embodiment, the oxygen amount at the interface 19A on the organic photoelectric conversion layer 18 side of the upper electrode 19 is larger than the oxygen amount of the transparent conductive material forming the lower electrode 15A by the annealing treatment. Therefore, the work function of the upper electrode 19 is allowed to be adjusted without reducing the transmittance of the upper electrode 19.

Next, still other modification examples (Modification Examples 3 and 4) of the photoelectric conversion device 10 of the above-described embodiment will be described below. In the following description, like components are denoted by like numerals as of the above-described embodiment and will not be further described.

Modification Example 3

Figure 49:
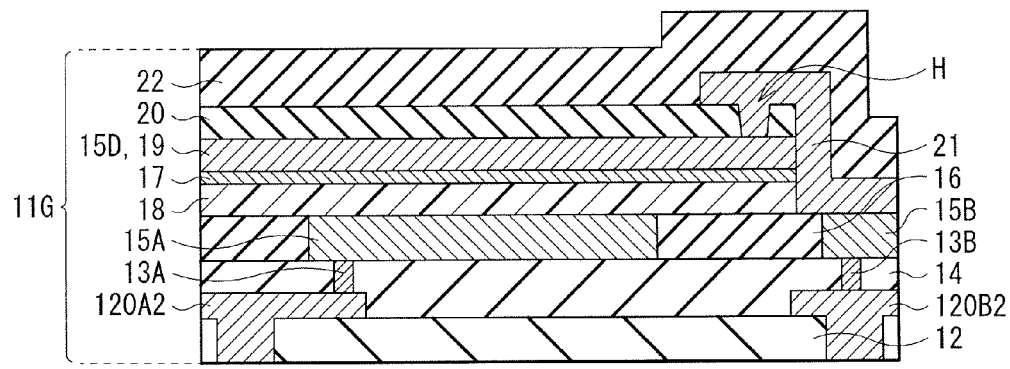
FIG. 49 is a sectional view illustrating a main-part configuration (an organic photoelectric conversion section) of a photoelectric conversion device (lower-side drawing of holes) according to Modification Example 3.

FIG. 49 illustrates a main-part configuration (an organic photoelectric conversion section 11G) of a photoelectric conversion device according to Modification Example 3. In the above-described embodiment, a case where electrons are drawn as signal charges from the lower electrode 15A in the organic photoelectric conversion section 11G is described as an example; however, the organic photoelectric conversion section 11G may be configured to draw holes as signal charges from the lower electrode 15A. However, in this case, the oxygen amount at the interface 19A on the organic photoelectric conversion layer 18 side of the upper electrode 19 is allowed to be smaller than the oxygen amount at the interface 15C on the organic photoelectric conversion layer 18 side of the lower electrode 15A.

In other words, in this modification example, contrary to the above-described embodiment, the upper electrode 19 corresponds to a specific example of "first electrode" in the present disclosure, and the lower electrode 15A corresponds to a specific example of "second electrode" in the present disclosure.

More specifically, as illustrated in FIG. 49, the inorganic oxide layer 17 is provided between the upper electrode 19 and the organic photoelectric conversion layer 18. A whole in the thickness direction from the interface 19A on the organic photoelectric conversion layer 18 side of the upper electrode 19 serves as the reduced layer 15D.

Figure 50:
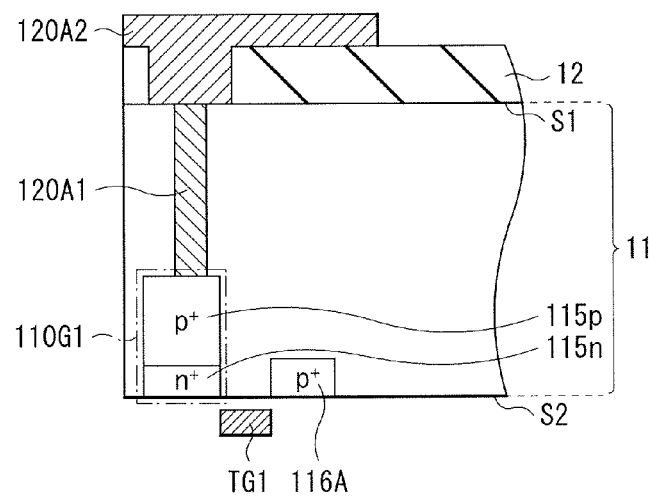
FIG. 50 is a sectional view illustrating a main-part configuration (a semiconductor substrate) of the photoelectric conversion device (lower-side drawing of holes) according to Modification Example 3.

FIG. 50 illustrates a main-part configuration (a part of the semiconductor substrate 11) of the photoelectric conversion device according to Modification Example 3. In this modification example, configurations of a storage layer (the green storage layer 110G1) formed in the semiconductor substrate 11 and a floating diffusion (an FD 116A) are different from those in the above-described embodiment. In other words, in the green storage layer 110G1, the p-type region 115p is connected as the hole storage layer to the conductive plug 120A1, and the n-type region 115n serving as an electron storage layer is formed in proximity to an interface between the p-type region 115p and the surface S2. Moreover, the FD 116A is formed as a p-type region. It is to be noted that, in a charge storing state, a lower potential VL than a potential applied to the upper electrode 18 is applied to the lower electrode 15A. Therefore, holes of the electron-hole pairs generated in the organic photoelectric conversion layer 17 are guided to the lower electrode 15A side to be drawn from the lower electrode 15A. These holes are stored in the p-type region 115p of the green storage layer 110G1 through the conductive plugs 120A1 and 120A2, and the like. In the reading operation, the stored holes are transferred to the FD 116A.

Modification Example 4

Figure 51:
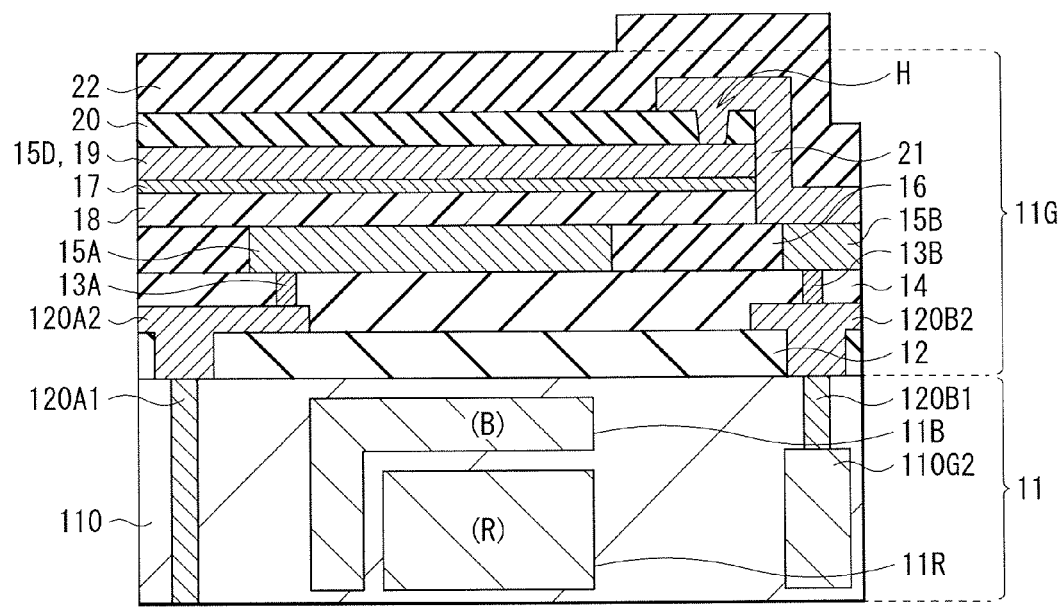
FIG. 51 is a sectional view illustrating a main-part configuration (an organic photoelectric conversion section and a semiconductor substrate) of a photoelectric conversion device (upper-side drawing) according to Modification Example 4.

FIG. 51 illustrates a main-part configuration (the organic photoelectric conversion section 11G and the semiconductor substrate 11) of a photoelectric conversion device according to Modification Example 4. In the above-described embodiment and Modification Example 3, a case where signal charges (electrons or holes) are drawn from the lower electrode 15A in the organic photoelectric conversion section 11G is described as an example; however, the organic photoelectric conversion section 11G may be configured to draw signal charges (electrons or holes) from the upper electrode 19. However, in this case, the oxygen amount at the interface 19A on the organic photoelectric conversion layer 18 side of the upper electrode 19 is allowed to be smaller than the oxygen amount at the interface 15C on the organic photoelectric conversion layer 18 side of the lower electrode 15A.

In other words, in this modification example, as with Modification Example 3, the upper electrode 19 corresponds to a specific example of "first electrode" in the present disclosure, and the lower electrode 15A corresponds to a specific example of "second electrode" in the present disclosure.

More specifically, as illustrated in FIG. 51, the inorganic oxide layer 17 is provided between the upper electrode 19 and the organic photoelectric conversion layer 18. A whole in the thickness direction from the interface 19A on the organic photoelectric conversion layer 18 side of the upper electrode 19 serves as the reduced layer 15D.

Moreover, this modification example has a configuration in which the green storage layer 110G2 formed to be embedded in the semiconductor substrate 11 is connected to the conductive plug 120B1 and is brought into conduction with the upper electrode 19 through the conductive plug 120B2, the wiring layers 13B and 15B, and the contact metal layer 20. It is to be noted that the configuration of the green storage layer 110G2 and the conduction type of the FD (not illustrated) are set in a similar manner to those in the above-described embodiment, and during charge storage, electrons are allowed to be drawn as signal charges from the upper electrode 19 to be stored in the green storage layer 110G2 by setting a potential applied to the upper electrode 19 to be higher than a potential applied to the lower electrode 15A. In this case, the holes are emitted from the lower electrode 15A side through the wiring layer 13A, and the conductive plugs 120A1 and 120A2.

Alternatively, the holes are allowed to be drawn as signal charges from the upper electrode 19 to be stored in the green storage layer 110G2 by setting the configuration of the green storage layer 110G2 and the conductive type of the FD (not illustrated) to those in the above-described Modification Example 3 in a similar manner and setting the potential applied to the upper electrode 19 to be lower than the potential applied to the lower electrode 15A during charge storage. In this case, the electrons are emitted from the lower electrode 15A side through the wiring layer 13A and the conductive plugs 120A1 and 120A2.

Application Example 1

Figure 52:
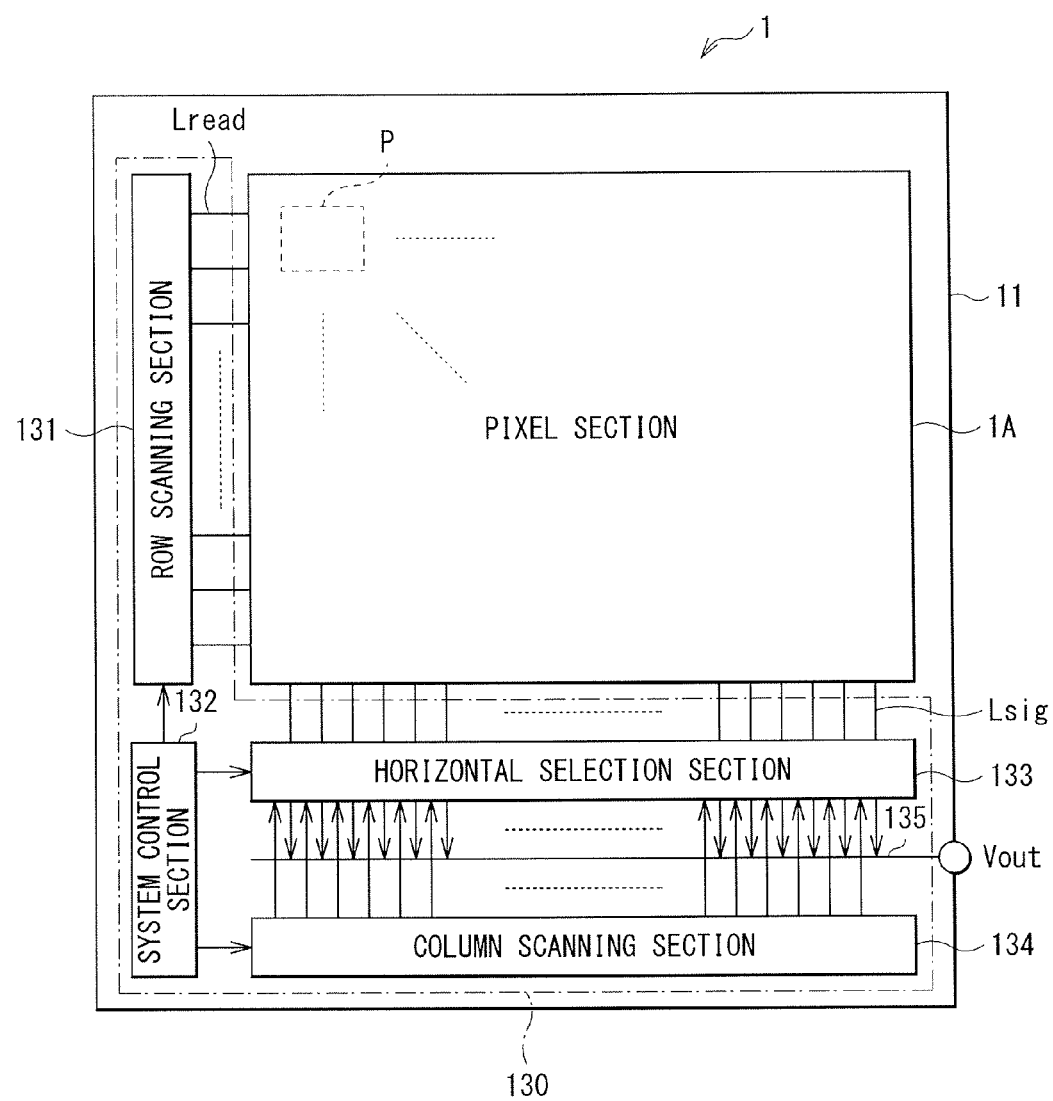
FIG. 52 is a functional block diagram of a solid-state image pickup unit using the photoelectric conversion device illustrated in FIG. 1 as a pixel.

FIG. 52 illustrates an entire configuration of a solid-state image pickup unit using, as each pixel, any of the photoelectric conversion devices described in the above-described embodiments. This solid-state image pickup unit 1 may be, for example, a CMOS image sensor, and includes a pixel section 1A as an image pickup area and a peripheral circuit section 130 in a peripheral region of the pixel section 1A on the semiconductor substrate 11. The peripheral circuit section 130 may include, for example, a row scanning section 131, a horizontal selection section 133, a horizontal selection section 134, and a system control section 132.

The pixel section 1A may include, for example, a plurality of pixels P (corresponding to the photoelectric conversion devices 10, and 10A to 10C) that are two-dimensionally arranged in a matrix form. Respective pixel drive lines Lread (more specifically, row selection lines and reset control lines) may be wired to, for example, respective pixel rows of the pixels P, and respective vertical signal lines Lsig may be wired to respective pixel columns of the pixels P. Each of the pixel drive lines Lread is configured to transmit a drive signal for signal reading from the pixel P. An end of each of the pixel drive line Lread is connected to an output end corresponding to each of the pixel rows of the row scanning section 131.

The row scanning section 131 is configured of a shift register, an address decoder, and the like, and may be, for example, a pixel drive section that drives respective pixels P of the pixel section 1A from one row to another. Signals output from the respective pixels P in a pixel row selected and scanned by the row scanning section 131 are supplied to the horizontal selection section 133 through the respective vertical signal lines Lsig. The horizontal selection section 133 may be configured of an amplifier, a horizontal selection switch, and the like provided to each of the vertical signal lines Lsig.

The column selection section 134 is configured of a shift register, an address decoder, and the like, and sequentially drives respective horizontal selection switches of the horizontal selection section 133 while scanning the horizontal selection switches. Signals of the respective pixels P transmitted through the respective vertical signal lines Lsig are sequentially output to a horizontal signal line 135 by selection scanning by the horizontal selection section 134, and are transmitted to a device external to the semiconductor substrate 11 through the horizontal signal line 135.

A circuit portion configured of the row scanning section 131, the horizontal selection section 133, the horizontal selection section 134, and the horizontal signal line 135 may be formed directly above the semiconductor substrate 11, or may be disposed in an external control IC. Alternatively, the circuit portion may be formed on another substrate connected by a cable or the like.

The system control section 132 is configured to receive data indicating a clock, an operation mode, or the like supplied from a device external to the semiconductor substrate 11, and to output data such as internal information of the solid-state image pickup unit 1. The system control section 132 further includes a timing generator configured to generate various kinds of timing signals, and performs drive control on peripheral circuits such as the row scanning section 131, the horizontal selection section 133, the horizontal selection section 134, and the like in response to the various kinds of timing signals generated by the timing generator.

Application Example 2

Figure 53:
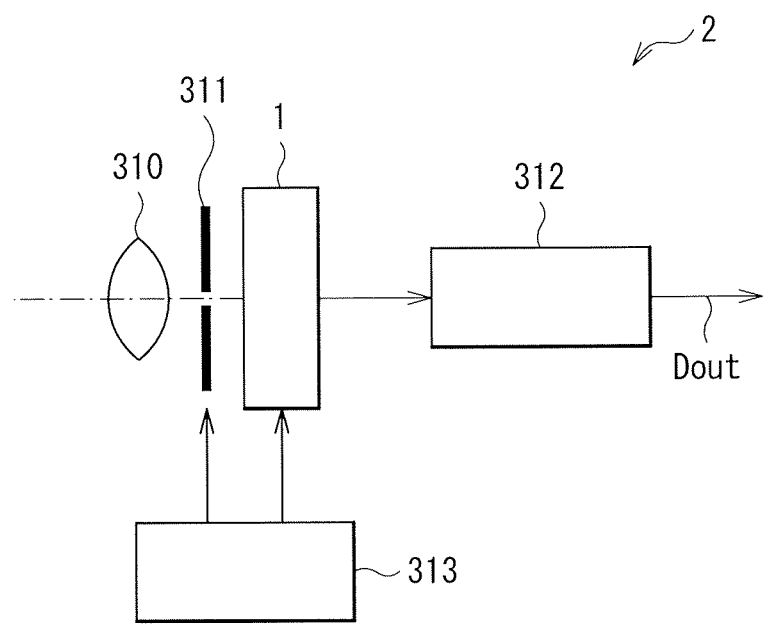
FIG. 53 is a block diagram illustrating a schematic configuration of an electronic apparatus using the solid-state image pickup unit illustrated in FIG. 52.

The above-described solid-state image pickup unit 1 is applicable to all kinds of electronic apparatuses having an image pickup function, for example, camera systems such as digital still cameras and video cameras, and cellular phones having an image pickup function. FIG. 53 illustrates a schematic configuration of an electronic apparatus 2 (a camera) as an example. The electronic apparatus 2 may be, for example, a video camera capable of taking a still image or a moving image, and includes the image pickup unit 1, an optical system (an optical lens) 310, a shutter unit 311, a drive section 313 configured to drive the solid-state image pickup unit 1 and the shutter unit 311, and a signal processing section 312.

The optical system 310 is configured to guide image light (incident light) from a subject to the pixel section 1A of the image pickup unit 1. The optical system 310 may include a plurality of optical lenses. The shutter unit 311 is configured to control a light irradiation period and a light-shielding period for the image pickup unit 1. The drive section 313 is configured to control a transfer operation of the solid-state image pickup unit 1 and a shutter operation of the shutter unit 311. The signal processing section 312 is configured to perform various kinds of signal processing on a signal output from the solid-state image pickup unit 1. An image signal Dout that has been subjected to signal processing may be stored in a storage medium such as a memory, or may be output to a monitor or the like.

Although the present disclosure is described referring to the above-described embodiments, the present disclosure is not limited thereto, and may be variously modified.

For example, in the above-described embodiments, the photoelectric conversion devices 10B and 10C have a configuration in which the organic photoelectric conversion section 11G detecting green light and the inorganic photoelectric conversion sections 11B and 11R detecting blue light and red light, respectively, are laminated; however, the present disclosure is not limited to such a configuration. In other words, the organic photoelectric conversion section may detect red light or blue light, and the inorganic photoelectric conversion section may detect green light. Moreover, the number of organic photoelectric conversion sections, the number of inorganic photoelectric conversion sections, a ratio between the organic photoelectric conversion sections and the inorganic photoelectric conversion sections are not limited, and two or more organic photoelectric conversion sections may be provided, or color signals of a plurality of colors may be obtained by only the organic photoelectric conversion section. Further, the present disclosure is not limited to a configuration in which organic photoelectric conversion sections and inorganic photoelectric conversion sections are laminated along the vertical direction, and organic photoelectric conversion sections and inorganic photoelectric conversion sections may be arranged side by side along a substrate surface.

Moreover, in the above-described embodiments and the like, the configurations of the back-side illumination type solid-state image pickup units are exemplified; however, the present disclosure is applicable to a front-side illumination type solid-state image pickup unit.

Further, it may not be necessary for the solid-state image pickup unit (the photoelectric conversion device) of the present disclosure to include all components described in the above-described embodiments, and the solid-state image pickup unit of the present disclosure may include any other layer.

In addition, in the above-described embodiments, as an example of the semiconductor device of the present disclosure, the photoelectric conversion device is described; however, the present disclosure is widely applicable to semiconductor devices, such as organic EL devices and organic solar cell devices, each including a functional layer between the first electrode and the second electrode, the functional layer including an organic film.

It is to be noted that the present technology is allowed to have following configurations.

(1) A semiconductor device including:
a functional layer between a first electrode and a second electrode, the functional layer including an organic film,
in which the first electrode and the second electrode are made of a same transparent conductive material, and
an oxygen amount at an interface on the functional layer side of the first electrode is smaller than an oxygen amount at an interface on the functional layer side of the second electrode.

(2) The semiconductor device according to (1), in which
the first electrode includes a reduced layer in a part or a whole in a thickness direction from the interface on the functional layer side, and
an oxygen amount of the reduced layer is smaller than the oxygen amount at the interface on the functional layer side of the second electrode.

(3) The semiconductor device according to (2), in which an inorganic oxide layer is included between the reduced layer and the functional layer.

(4) The semiconductor device according to (3), in which
the functional layer is a photoelectric conversion layer, and
the inorganic oxide layer is a hole block layer.

(5) The semiconductor device according to (2), in which a first inorganic oxide layer and a second inorganic oxide layer are included between the reduced layer and the functional layer.

(6) The semiconductor device according to (5), in which
the functional layer is a photoelectric conversion layer,
the first inorganic oxide layer is a work function adjustment layer, and
the second inorganic oxide layer is a hole block layer.

(7) The semiconductor device according to any one of (3) to (6), in which the inorganic oxide layer is made of one or more kinds of a group configured of tantalum oxide, molybdenum oxide, vanadium oxide, tungsten oxide, hafnium oxide, and cesium oxide.

(8) The semiconductor device according to (1), in which the oxygen amount at the interface on the functional layer of the second electrode is larger than the oxygen amount at the interface on the functional layer side of the first electrode.

(9) The semiconductor device according to any one of (1) to (8), in which the transparent conductive material is configured of one or more kinds of a group configured of ITO (indium tin oxide), a tin oxide ($SnO_2$)-based material doped with a dopant, aluminum zinc oxide, gallium zinc oxide, indium zinc oxide, CuI, $InSbO_4$, ZnMgO, $CuInO_2$, $MgIn_2O_4$, CdO, and $ZnSnO_3$.

(10) A method of manufacturing a semiconductor device including:
forming a first electrode made of a transparent conductive material;
forming an inorganic oxide layer with a higher metal content ratio than that in an ideal composition on the first electrode;
forming a reduced layer in a part or a whole in a thickness direction from an interface on the functional layer side of the first electrode by annealing treatment and allowing an oxygen amount of the reduced layer to be smaller than an oxygen amount of the transparent conductive material;
forming a functional layer including an organic film on the inorganic oxide layer; and
forming a second electrode made of the same transparent conductive material as that of the first electrode on the functional layer.

(11) A method of manufacturing a semiconductor device including:
forming a first electrode made of a transparent conductive material;
forming a first layer and a second layer on the first electrode in this order from the first electrode side, the first layer made of an inorganic oxide or a metal with a higher metal content ratio than that in an ideal composition, and the second layer made of an inorganic oxide with a larger oxygen amount than that of the first layer;
forming a reduced layer in a part or a whole in a thickness direction from an interface on the functional layer side of the first electrode by annealing treatment, and allowing an oxygen amount of the reduced layer to be smaller than an oxygen amount of the transparent conductive material;
forming a functional layer including an organic film on the second layer; and
forming a second electrode made of the same transparent conductive material as that of the first electrode on the functional layer.

(12) The method of manufacturing the semiconductor device according to (10) or (11), in which the inorganic oxide is configured of one or more kinds of a group configured of molybdenum oxide, vanadium oxide, tungsten oxide, hafnium oxide, and cesium oxide.

(13) A method of manufacturing a semiconductor device including:
forming a first electrode made of a transparent conductive material;
forming a functional layer including an organic film on the first electrode;
forming a second electrode made of the same transparent conductive material as that of the first electrode on the functional layer; and
allowing, by annealing treatment, an oxygen amount at an interface on the functional layer side of the second electrode to be larger than an oxygen amount at an interface on the functional layer side of the first electrode.

(14) The method of manufacturing the semiconductor device according to (13), including
forming a hard mask made of a transparent material on the second electrode,
in which the annealing treatment is performed in a film formation chamber in which the hard mask is formed.

(15) The method of manufacturing the semiconductor device according to any one of (10) to (14), in which the transparent conductive material is configured of one or more kinds of a group configured of ITO (indium tin oxide), a tin oxide ($SnO_2$)-based material doped with a dopant, aluminum zinc oxide, gallium zinc oxide, indium zinc oxide, CuI, $InSbO_4$, ZnMgO, $CuInO_2$, $MgIn_2O_4$, CdO, and $ZnSnO_3$.

(16) A solid-state image pickup unit provided with pixels each of which includes one or a plurality of organic photoelectric conversion sections, the organic photoelectric conversion sections each including:
a functional layer between a first electrode and a second electrode, the functional layer including an organic film,
in which the first electrode and the second electrode are made of a same transparent conductive material, and
an oxygen amount at an interface on the functional layer side of the first electrode is smaller than an oxygen amount at an interface on the functional layer side of the second electrode.

(17) The solid-state image pickup unit according to (16), in which in each pixel, the one or the plurality of organic photoelectric conversion sections and one or a plurality of inorganic photoelectric conversion sections are laminated, the inorganic photoelectric conversion sections configured to perform photoelectric conversion on a wavelength range different from that in the organic photoelectric conversion sections.

(18) The solid-state image pickup unit according to (17), in which
the inorganic photoelectric conversion section is formed to be embedded in a semiconductor substrate, and
the organic photoelectric conversion section is formed on a first surface side of the semiconductor substrate.

(19) The solid-state image pickup unit according to (18), in which a multilayer wiring layer is formed on a second surface side of the semiconductor substrate.

(20) An electronic apparatus provided with a solid-state image pickup unit, the solid-state image pickup unit including pixels each of which includes one or a plurality of organic photoelectric conversion sections, the organic photoelectric conversion sections each including:
a functional layer between a first electrode and a second electrode, the functional layer including an organic film,
in which the first electrode and the second electrode are made of a same transparent conductive material, and
an oxygen amount at an interface on the functional layer side of the first electrode is smaller than an oxygen amount at an interface on the functional layer side of the second electrode.

The present disclosure contains subject matter related to that disclosed in Japanese Priority Patent Application No. 2012-171885 filed in the Japan Patent Office on Aug. 2, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device comprising:
a functional layer between a first electrode and a second electrode, the functional layer including an organic film,
wherein the first electrode and the second electrode are made of a same transparent conductive material, and
an oxygen amount at an interface on the functional layer side of the first electrode is smaller than an oxygen amount at an interface on the functional layer side of the second electrode.

2. The semiconductor device according to claim 1, wherein
the first electrode includes a reduced layer in a part or a whole in a thickness direction from the interface on the functional layer side, and
an oxygen amount of the reduced layer is smaller than the oxygen amount at the interface on the functional layer side of the second electrode.

3. The semiconductor device according to claim 2, wherein an inorganic oxide layer is included between the reduced layer and the functional layer.

4. The semiconductor device according to claim 3, wherein
the functional layer is a photoelectric conversion layer, and
the inorganic oxide layer is a hole block layer.

5. The semiconductor device according to claim 2, wherein a first inorganic oxide layer and a second inorganic oxide layer are included between the reduced layer and the functional layer.

6. The semiconductor device according to claim 5, wherein
the functional layer is a photoelectric conversion layer,
the first inorganic oxide layer is a work function adjustment layer, and
the second inorganic oxide layer is a hole block layer.

7. The semiconductor device according to claim 3, wherein the inorganic oxide layer is made of one or more kinds of a group consisting of tantalum oxide, molybdenum oxide, vanadium oxide, tungsten oxide, hafnium oxide, and cesium oxide.

8. The semiconductor device according to claim 1, wherein the oxygen amount at the interface on the functional layer side of the second electrode is larger than the oxygen amount at the interface on the functional layer side of the first electrode.

9. The semiconductor device according to claim 1, wherein the transparent conductive material is configured of one or more kinds of a group consisting of ITO (indium tin oxide), a tin oxide ($SnO_2$)-based material doped with a dopant, aluminum zinc oxide, gallium zinc oxide, indium zinc oxide, CuI, $InSbO_4$, ZnMgO, $CuInO_2$, $MgIn_2O_4$, CdO, and $ZnSnO_3$.

10. A method of manufacturing a semiconductor device comprising:
forming a first electrode made of a transparent conductive material;
forming an inorganic oxide layer with a higher metal content ratio than that in an ideal composition on the first electrode;
forming a reduced layer in a part or a whole in a thickness direction from an interface on a functional layer side of the first electrode by annealing treatment and allowing an oxygen amount of the reduced layer to be smaller than an oxygen amount of the transparent conductive material;

forming the functional layer including an organic film on the inorganic oxide layer; and forming a second electrode made of the same transparent conductive material as that of the first electrode on the functional layer.

11. The method of manufacturing the semiconductor device according to claim 10, wherein the inorganic oxide is configured of one or more kinds of a group consisting of molybdenum oxide, vanadium oxide, tungsten oxide, hafnium oxide, and cesium oxide.

12. The method of manufacturing the semiconductor device according to claim 10, wherein the transparent conductive material is configured of one or more kinds of a group consisting of ITO (indium tin oxide), a tin oxide ($SnO_2$)-based material doped with a dopant, aluminum zinc oxide, gallium zinc oxide, indium zinc oxide, CuI, $InSbO_4$, ZnMgO, $CuInO_2$, $MgIn_2O_4$, CdO, and $ZnSnO_3$.

13. A method of manufacturing a semiconductor device comprising:

forming a first electrode made of a transparent conductive material;

forming a first layer and a second layer on the first electrode in this order from the first electrode side, the first layer made of an inorganic oxide with a higher metal content ratio than that in an ideal composition or a metal, and the second layer made of an inorganic oxide with a larger oxygen amount than that of the first layer;

forming a reduced layer in a part or a whole in a thickness direction from an interface on a functional layer side of the first electrode by annealing treatment and allowing an oxygen amount of the reduced layer to be smaller than an oxygen amount of the transparent conductive material;

forming the functional layer including an organic film on the second layer; and forming a second electrode made of the same transparent conductive material as that of the first electrode on the functional layer.

14. A method of manufacturing a semiconductor device comprising:

forming a first electrode made of a transparent conductive material;

forming a functional layer including an organic film on the first electrode;

forming a second electrode made of the same transparent conductive material as that of the first electrode on the functional layer; and allowing, by annealing treatment, an oxygen amount at an interface on the functional layer side of the second electrode to be larger than an oxygen amount at an interface on the functional layer side of the first electrode.

15. The method of manufacturing the semiconductor device according to claim 14, comprising forming a hard mask made of a transparent material on the second electrode, wherein the annealing treatment is performed in a film formation chamber in which the hard mask is formed.

16. A solid-state image pickup unit provided with pixels each of which includes one or a plurality of organic photoelectric conversion sections, the organic photoelectric conversion sections each comprising:

a functional layer between a first electrode and a second electrode, the functional layer including an organic film, wherein the first electrode and the second electrode are made of a same transparent conductive material, and an oxygen amount at an interface on the functional layer side of the first electrode is smaller than an oxygen amount at an interface on the functional layer side of the second electrode.

17. The solid-state image pickup unit according to claim 16, wherein in each pixel, the one or the plurality of organic photoelectric conversion sections and one or a plurality of inorganic photoelectric conversion sections are laminated, the inorganic photoelectric conversion sections configured to perform photoelectric conversion on a wavelength range different from that in the organic photoelectric conversion sections.

18. The solid-state image pickup unit according to claim 17, wherein the inorganic photoelectric conversion section is formed to be embedded in a semiconductor substrate, and the organic photoelectric conversion section is formed on a first surface side of the semiconductor substrate.

19. The solid-state image pickup unit according to claim 18, wherein a multilayer wiring layer is formed on a second surface side of the semiconductor substrate.

20. An electronic apparatus provided with a solid-state image pickup unit, the solid-state image pickup unit including pixels each of which includes one or a plurality of organic photoelectric conversion sections, the organic photoelectric conversion sections each comprising:

a functional layer between a first electrode and a second electrode, the functional layer including an organic film, wherein the first electrode and the second electrode are made of a same transparent conductive material, and an oxygen amount at an interface on the functional layer side of the first electrode is smaller than an oxygen amount at an interface on the functional layer side of the second electrode.

* * * * *